(12) United States Patent
Rush et al.

(10) Patent No.: US 11,428,475 B2
(45) Date of Patent: Aug. 30, 2022

(54) ADDITIVELY MANUFACTURED STRUCTURES FOR THERMAL AND/OR MECHANICAL SYSTEMS, AND METHODS FOR MANUFACTURING THE STRUCTURES

(71) Applicant: General Electric Company, Schenectady, NY (US)

(72) Inventors: Brian Magann Rush, Niskayuna, NY (US); Daniel Jason Erno, Clifton Park, NY (US); Thomas Adcock, Glenville, NY (US); Stefano Angelo Mario Lassini, Lowell, MI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 40 days.

(21) Appl. No.: 16/923,080

(22) Filed: Jul. 8, 2020

(65) Prior Publication Data
US 2020/0333084 A1 Oct. 22, 2020

Related U.S. Application Data

(62) Division of application No. 16/034,050, filed on Jul. 12, 2018, now Pat. No. 10,746,479.
(Continued)

(51) Int. Cl.
*F28D 15/00* (2006.01)
*F28D 15/04* (2006.01)
(Continued)

(52) U.S. Cl.
CPC ............ *F28D 15/046* (2013.01); *B33Y 80/00* (2014.12); *B64G 1/506* (2013.01); *H01L 23/427* (2013.01);
(Continued)

(58) Field of Classification Search
CPC .......... F28D 15/046; F28D 2021/0021; B33Y 80/00; B33Y 10/00; B64G 1/506; H01L 23/427; B23K 26/342
(Continued)

(56) References Cited

U.S. PATENT DOCUMENTS

| 2007/0084587 A1* | 4/2007 | Huang | B22F 7/002 |
| | | | 165/104.26 |
| 2009/0000332 A1* | 1/2009 | Kondo | H01L 23/427 |
| | | | 62/509 |

(Continued)

*Primary Examiner* — Davis D Hwu
(74) *Attorney, Agent, or Firm* — Wood IP LLC

(57) ABSTRACT

A cooling assembly includes walls extending around and defining an enclosed vapor chamber that holds a working fluid. An interior porous wick structure is disposed inside the chamber and lines interior surfaces of the walls. The wick structure includes pores that hold a liquid phase of the working fluid. The cooling assembly also includes an exterior porous wick structure lining exterior surfaces of the walls outside of the vapor chamber. The exterior wick structure includes pores that hold a liquid phase of a cooling fluid outside the vapor chamber. The interior wick structure holds the liquid working fluid until heat from an external heat source vaporizes the working fluid inside the vapor chamber. The exterior wick structure holds the liquid fluid outside the vapor chamber until heat from inside the vapor chamber vaporizes the liquid cooling fluid in the exterior wick structure for transferring heat away from the heat source.

18 Claims, 18 Drawing Sheets

Related U.S. Application Data

(60) Provisional application No. 62/628,469, filed on Feb. 9, 2018.

(51) Int. Cl.
| | |
|---|---|
| *B33Y 80/00* | (2015.01) |
| *B64G 1/50* | (2006.01) |
| *H01L 23/427* | (2006.01) |
| *B23K 26/342* | (2014.01) |
| *B33Y 10/00* | (2015.01) |
| *F28D 21/00* | (2006.01) |

(52) U.S. Cl.
CPC ............ *B23K 26/342* (2015.10); *B33Y 10/00* (2014.12); *F28D 2021/0021* (2013.01)

(58) Field of Classification Search
USPC .................................................. 165/104.26
See application file for complete search history.

(56) References Cited

U.S. PATENT DOCUMENTS

| | | | |
|---|---|---|---|
| 2017/0047625 A1* | 2/2017 | Bhunia | H01M 50/20 |
| 2018/0031330 A1* | 2/2018 | Roberts | H01L 23/427 |

* cited by examiner

300

ADDITIVELY MANUFACTURED STRUCTURES FOR THERMAL AND/OR MECHANICAL SYSTEMS, AND METHODS FOR MANUFACTURING THE STRUCTURES

CROSS-REFERENCE TO RELATED APPLICATIONS

This application is a divisional of U.S. application Ser. No. 16/034,050, now allowed, which was filed on 12 Jul. 2018, and is incorporated herein by reference. U.S. application Ser. No. 16/034,050 claims priority to U.S. Provisional Application No. 62/628,469, which was filed on 9 Feb. 2018, and the entire disclosure of which is incorporated herein by reference.

STATEMENT REGARDING FEDERALLY SPONSORED RESEARCH OR DEVELOPMENT

This invention was made with Government support under contract number N66001-17-C-4006 awarded by the Defense Advanced Research Projects Agency. The Government has certain rights in this invention.

FIELD

The subject matter described herein relates to structures made using additive manufacturing.

BACKGROUND

Operation of electronic devices can require thermal management to ensure proper function. As the electronic devices become heated, the devices can suffer from degradation, functional failure, and lower lifespan. For example, the capability of avionics electronics is determined by the computing processing ability of the system. Typically, there are size and weight constraints for an avionics system. These systems are thermally limited such that, for a given volume, only a certain number of cores or processors can operate before thermal issues such as overheating occurs. The processors can be de-rated to avoid overheating in high ambient temperature environments, but at the cost of potentially drastic reductions in processing capability. If the heat can be effectively removed from the system, more processing power, and ultimately more processing capability, may be possible from the same volume and weight.

There are a number of conventional cooling methods such as fans and heatsinks that are currently used to remove heat from the electronic circuitry and maintain the operational temperature range for the electronics. Technological improvements have continued to increase the device density and reduce packaging while also increasing the computing power and functionality such that thermal management systems are a key operational element. In addition, certain applications have restrictions in the size and weight that limit the cooling capacity and therefore limit the processing power and functionality of the electronics.

BRIEF DESCRIPTION

In one embodiment, a cooling assembly includes walls extending around and defining an enclosed vapor chamber configured to hold a liquid phase and a gas phase of a working fluid inside the vapor chamber. The vapor chamber extends along at least two orthogonal dimensions. The cooling assembly also includes interior porous wick structure disposed inside and lining one or more interior surfaces of the walls. The interior porous wick structure includes pores that are configured to hold the liquid phase of the working fluid inside the vapor chamber. The cooling assembly also includes an exterior porous wick structure lining one or more exterior surfaces of the walls outside of the vapor chamber. The exterior porous wick structure includes pores that are configured to hold a liquid phase of a cooling fluid outside of the vapor chamber. The pores of the interior porous wick structure are configured to hold the liquid phase of the working fluid inside the vapor chamber until heat from a heat source external to the vapor chamber vaporizes the liquid phase of the working fluid inside the vapor chamber into the gas phase inside the enclosed vapor chamber. The exterior porous wick structure is configured to hold the liquid phase of the cooling fluid outside of the vapor chamber until at least some of the heat from inside the enclosed vapor chamber vaporizes the liquid phase of the cooling fluid in the exterior porous wick structure outside of the vapor chamber into the gas phase outside of the enclosed vapor chamber for transferring the heat from the heat source away from the heat source.

In one embodiment, an additively manufactured assembly includes a porous wick structure including pores that are configured to hold a liquid phase of a fluid. One or more of a thickness of the porous wick structure is not uniform along one or more of a length or a width of the porous wick structure, and/or a size of the pores in the porous wick structure is not uniform along one or more of the length, the width, and/or the thickness of the porous wick structure.

In one embodiment, a method includes obtaining a single three-dimensional model of a chamber to be formed using an additive manufacturing system, and laser welding metal particles using a single pass of the laser according to the single three-dimensional model of the chamber to form a thin, hermetic outer wall of the chamber.

BRIEF DESCRIPTION OF THE DRAWINGS

The inventive subject matter may be understood from reading the following description of non-limiting embodiments, with reference to the attached drawings, wherein below.

DETAILED DESCRIPTION

One or more embodiments of the inventive subject matter described herein relates to integrated thermal and mechanical structures that can be used in systems for cooling electronics, including three-dimensional printed conformal vapor chambers. Not all embodiments of the inventive subject matter described herein, however, is limited to vapor chambers or cooling structures.

Figure 1:
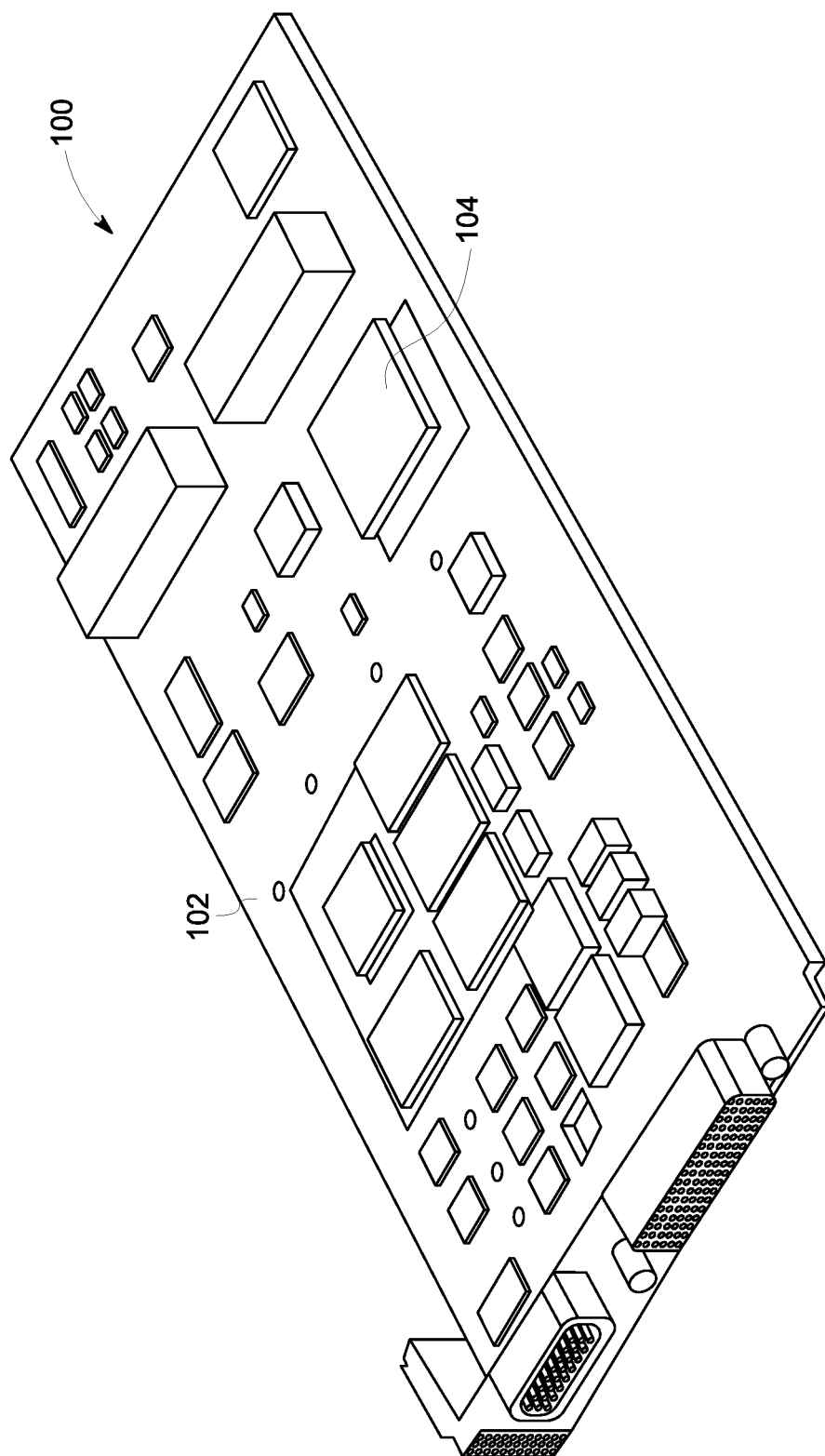
FIG. 1 illustrates one example of an electronic device.

One embodiment of the inventive subject matter described herein includes an integrated vapor chamber and exterior porous evaporator used as a cooling system. FIG. 1 illustrates one example of an electronic device 100, such as a circuit card assembly with electronic components on a circuit card mated to a heat frame. The device 100 includes a circuit card 102 with one or more electronic components 104 mounted thereon. The components 104 can include devices such as processors that generate considerable heat. The device 100 is one non-limiting example of the types of devices that may be used in conjunction with one or more embodiments of the inventive subject matter described herein.

Figure 2:
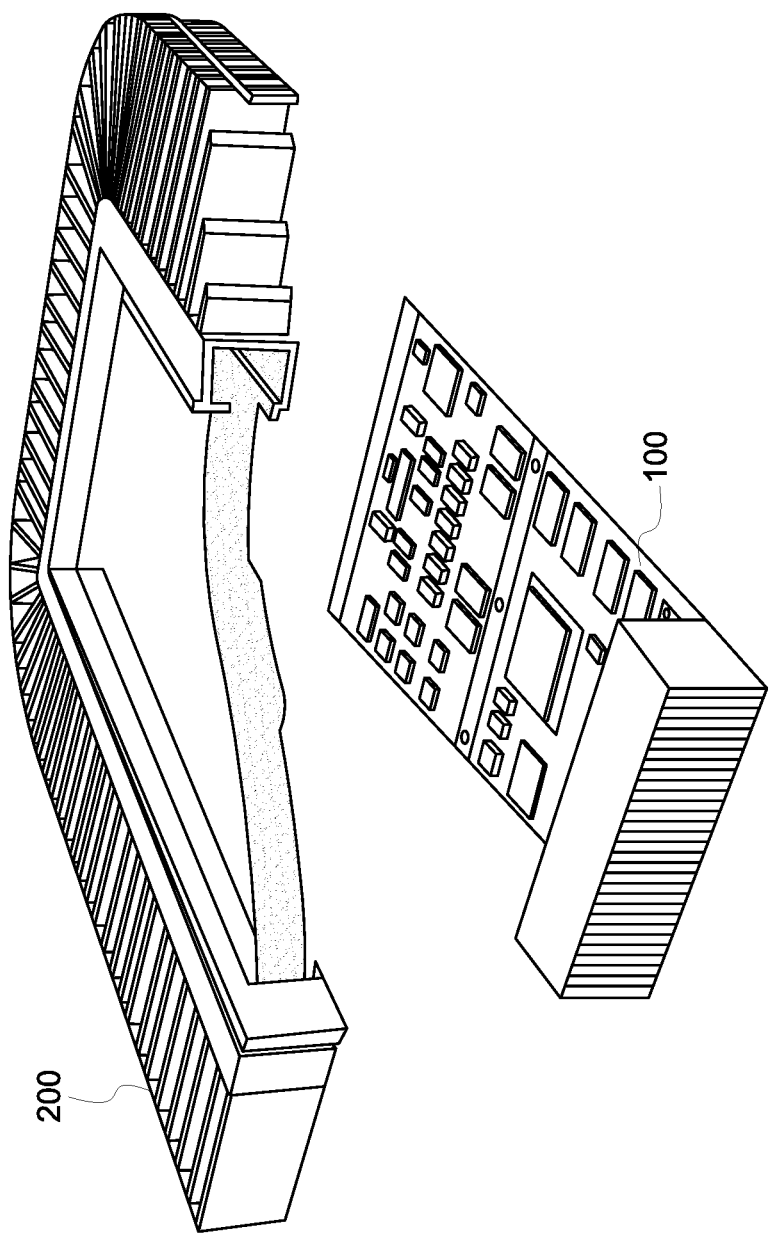
FIG. 2 illustrates one example of stacked modular vapor chamber assemblies and corresponding electronic devices assembled into an electronics system with corresponding input/output modules.
Figure 3:
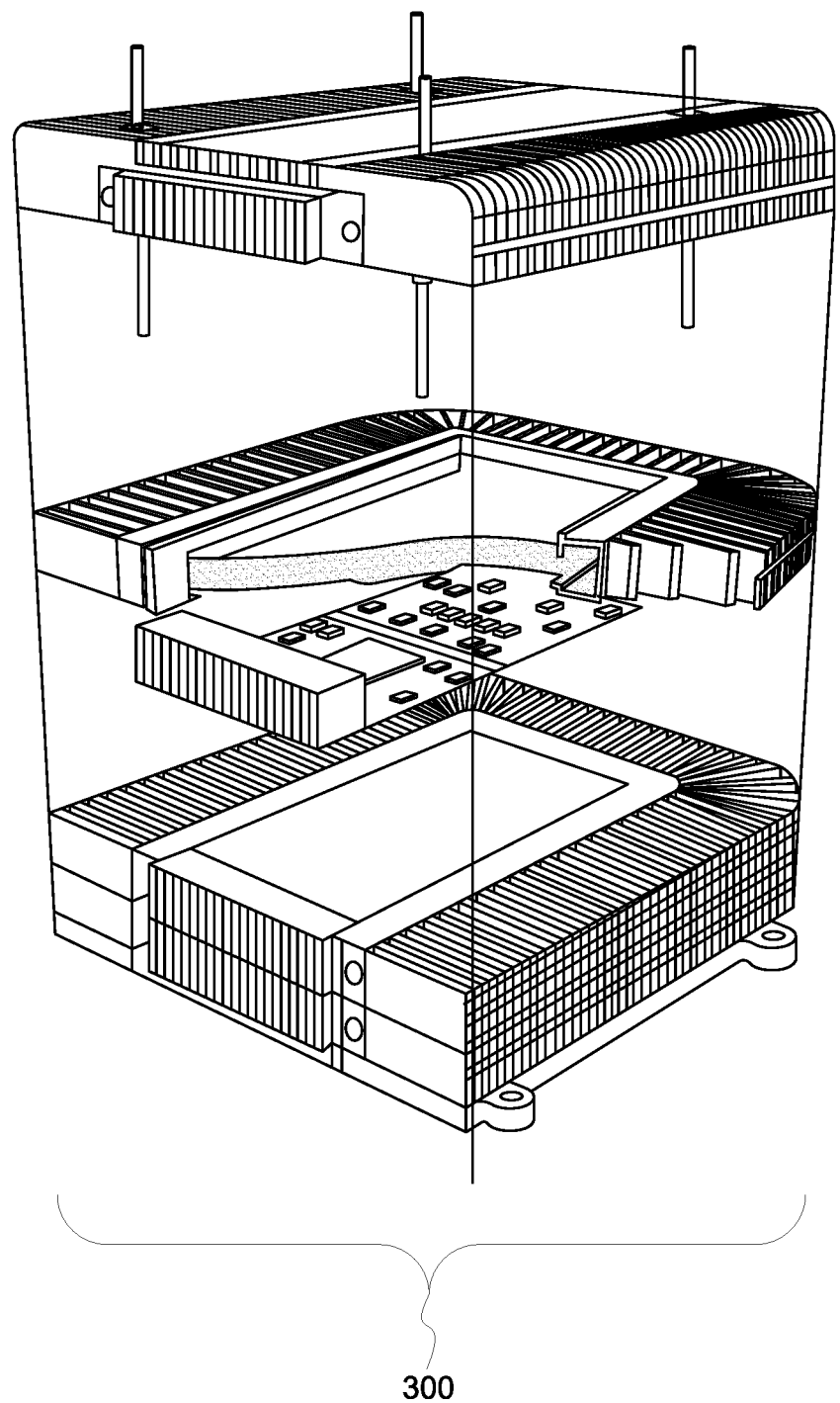
FIG. 3 illustrates the stacked modular vapor chamber assemblies shown in FIG. 2.
Figure 4:
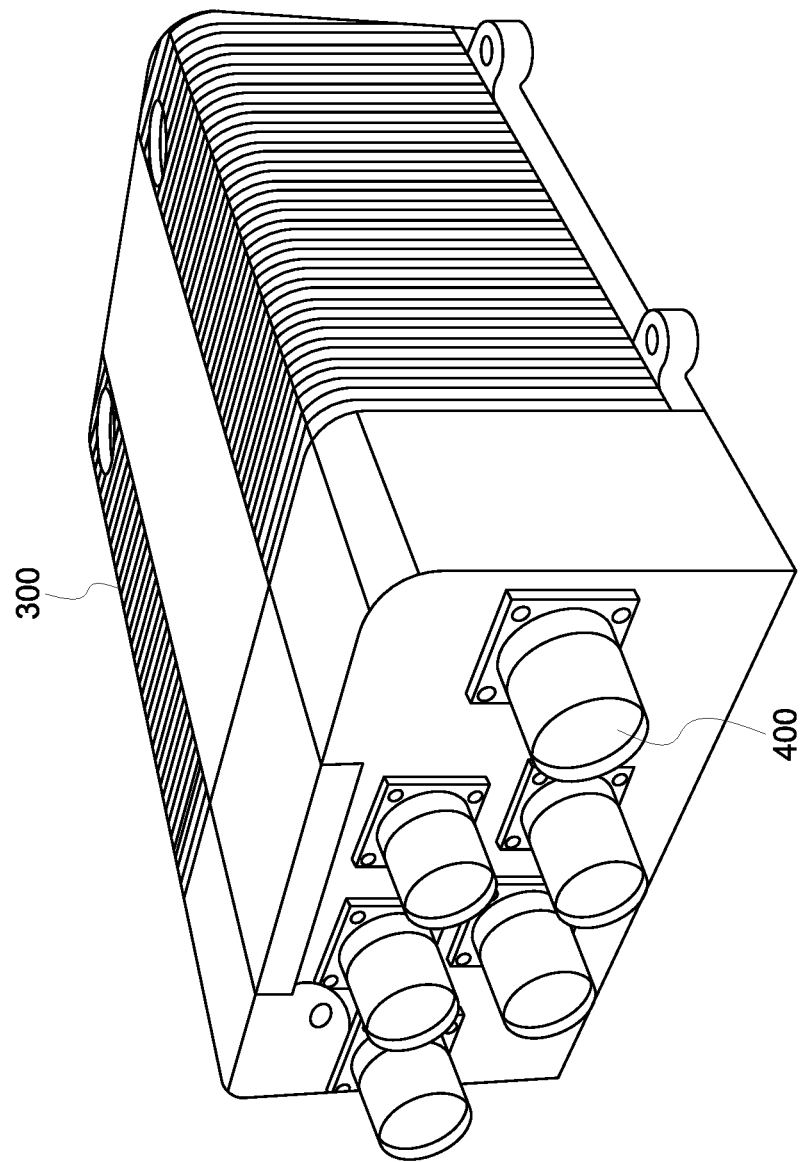
FIG. 4 illustrates the stacked modular vapor chamber assemblies shown in FIGS. 2 and 3.

FIGS. 2 through 4 illustrate one example of stacked modular vapor chamber assemblies 200 and corresponding electronic devices 100 assembled into an electronics system 300 with corresponding input/output modules 400. The electronic devices 100 can be coupled to both sides of a vapor chamber assembly 200 to form a vapor chamber sandwich. The vapor chamber assembly 200 can be disposed between two electronic devices 100. Several vapor chamber assemblies 200 can be stacked together and secured to each other to form the modular electronic system 300. The modular electronic system 300 can be electrically coupled to a backplane or input/output modules 400 to form the system 300 as shown in FIG. 4.

Figure 5:
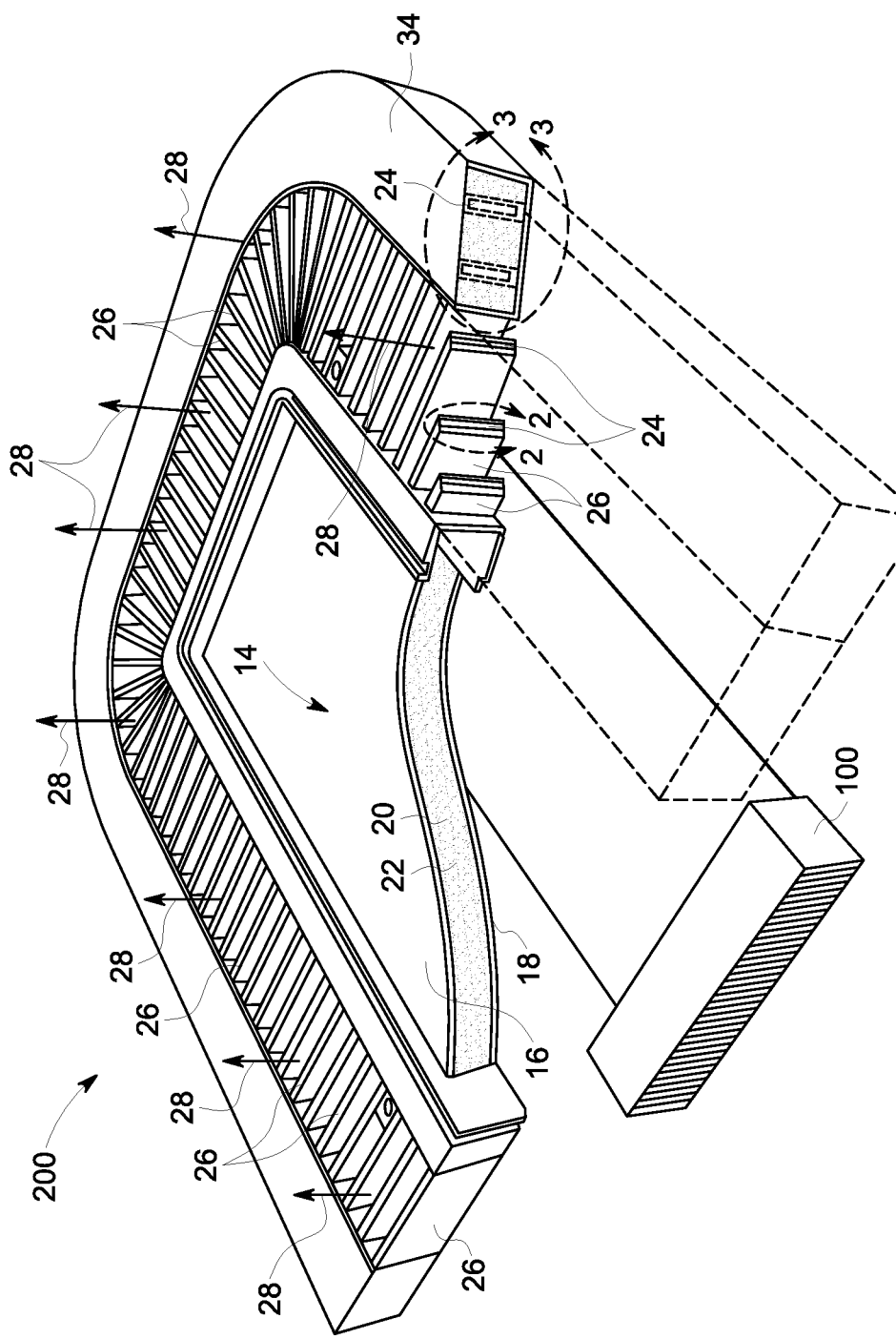
FIG. 5 illustrates one embodiment of a partial cutaway perspective view of an embodiment of the vapor chamber assembly shown in FIGS. 2 through 4.
Figure 6:
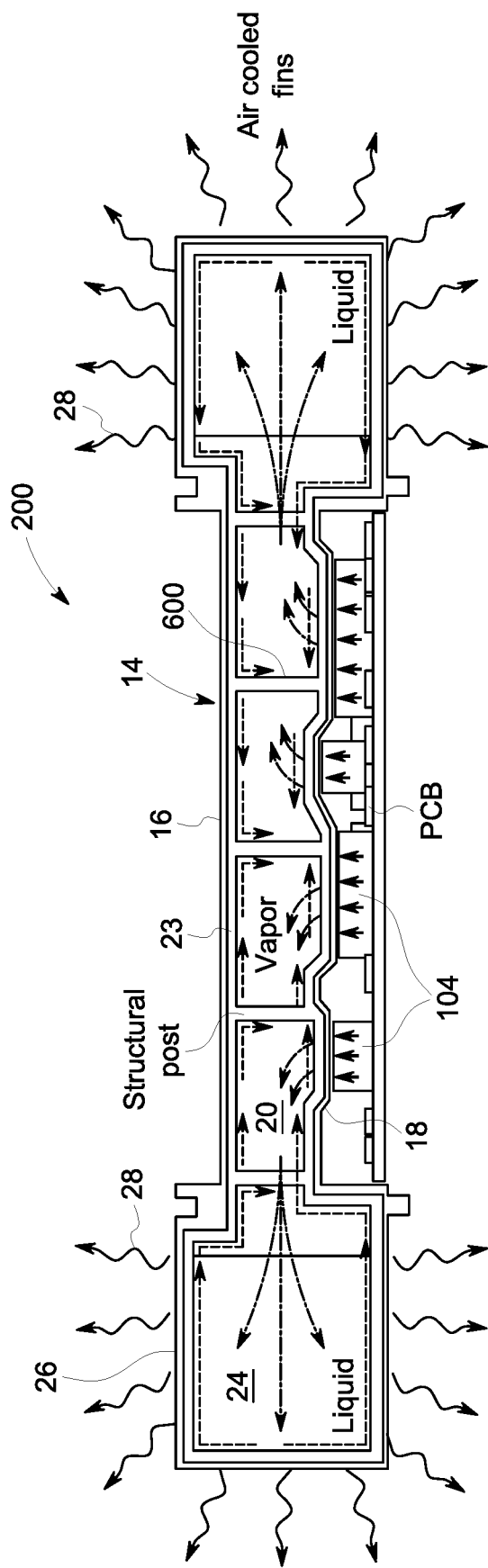
FIG. 6 illustrates a cross-sectional view of the vapor chamber assembly shown in FIGS. 2 through 5.

FIG. 5 illustrates one embodiment of a partial cutaway perspective view of an embodiment of the vapor chamber assembly 200 shown in FIGS. 2 through 4. FIG. 6 illustrates a cross-sectional view of the vapor chamber assembly 200 shown in FIGS. 2 through 5. The vapor chamber assembly 200 removes thermal energy from an electrical and/or mechanical heat source (e.g., the electronic device 100) in steady and/or unsteady cooling conditions. For example, the vapor chamber assembly 200 may remove thermal energy from a chip, electronic card, motherboard, etc. In order to rapidly remove thermal energy from the device 100, the vapor chamber assembly 200 includes a vapor housing 14 with low thermal resistance. The vapor housing 14 includes a first plate 16 and a second plate 18 that form a cavity 20, also referred to as a vapor chamber 20. In some embodiments, the first and second plates 16, 18 may be manufactured so that they conform to one or more surfaces of the electronic device 100.

The vapor housing 14 can increase heat transfer by reducing or minimizing a distance between the vapor housing 14 and the electronic device 100 (e.g., the vapor housing 14 may directly contact or nearly contact one or more surfaces of the device 100 and/or one or more hot components 104 of the device 100). Furthermore, in some embodiments, there may be multiple vapor chamber assemblies 200 stacked one on top of the other with the electronic device 100 between two or more of the vapor chamber assemblies 200. The electronic device 100 may have the same or different shapes and the vapor chamber assemblies 200 (e.g., vapor housing 14) may conform to those shapes.

In operation, the vapor housing 14 conducts energy from the device 100 through the first or second plates 16, 18, depending on which plate is next to the device 100. In some embodiments, both the first and second plates 16, 18 may be in contact with separate devices 100. As the first plate 16 and/or second plate 18 absorb thermal energy, the first plate 16 and/or second plate 18 transfer the thermal energy to a working fluid 22 (e.g., water, ammonia, etc.) within the cavity 20. This working fluid 22 may be in a liquid state in a porous wicking surface 23 disposed on inner surfaces of the plates 16, 18.

As the fluid 22 absorbs the thermal energy, the fluid 22 phase changes from a liquid to a gas. In the vapor phase or gas phase, the fluid 22 enters one or more passages 24 in a conduit or fin 26. These passages 24 also can be referred to as vapor chambers or fin vapor chambers. In some embodiments, the vapor housing 14 may include one or more conduits or fins 26 (e.g., 1, 5, 10, 15, 20, 25 or more), with each conduit or fin 26 having one or more passages 24 (e.g., 1, 2, 3, 4, 5, or more) that receive the fluid 22.

During steady cooling conditions, a cooling fluid 28 (e.g., gas and/or liquid) flows around the fins 26 and convectively removes thermal energy from the fins 26 to cool the working fluid 22. As the cooling fluid 28 removes thermal energy from the fins 26, the working fluid 22 cools and condenses (e.g., changes from a vapor phase or gas phase into a liquid phase). The liquid phase of the working fluid 22 then recirculates back to the cavity 20 through gravity and/or capillary forces where the working fluid 22 again absorbs thermal energy from the first and/or second plates 16, 18.

The vapor chamber assembly 200 can be created using additive manufacturing. Additive manufacturing can involve joining or solidifying material under computer control to create a three-dimensional object, such as by adding liquid molecules or fusing powder grains with each other. Examples of additive manufacturing include three-dimensional (3D) printing, rapid prototyping (RP), direct digital manufacturing (DDM), selective laser melting (SLM), electron beam melting (EBM), direct metal laser melting (DMLM), or the like. Alternatively, the vapor chamber assembly 200 can be formed in another manner.

As described above, the interior surfaces of the vapor chambers 20 and/or 24 can be lined with a porous wick structure or lining 23. This porous wick structure or lining 23 can be formed using additive manufacturing and may be formed from laser-welded powder. Alternatively, the porous wick lining 23 can be formed using another technique and/or from another material. The porous wick lining 23 can line the entire interior surfaces of the vapor chambers 20 and/or 24 and can hold liquid coolant while vapor coolant is outside of the lining 23 in the chambers 20 and/or 24.

The sealed vapor chambers 20, 24 hold the liquid coolant (e.g., water) and gaseous coolant (e.g., water vapor) in thermodynamic equilibrium. Under these conditions, when heat is introduced into the vaper chamber 20 and heat is removed from the vapor chamber 20 at another location, such as the cooling fins 26, a very efficient heat transfer process occurs. This process involves the heat entering the hermetic wall of the vapor chamber 20 and reaching the liquid coolant in the porous wick lining 23 right adjacent to the hermetic wall. The liquid coolant (e.g., liquid water) is vaporized by the heat, and the vapor moves to where the vapor can condense, in this case the cooling fins 26. The vapor condenses back into water and, upon doing so, releases heat back into the walls of the fins 26 which go to the air. The liquid water enters back into the porous wick lining 23 and can be drawn back toward the chambers 20 by capillary action (e.g., capillary wicking forces).

In the illustrated embodiment, the vapor chamber assembly 200 includes supporting columns 600 that extend between the opposing plates 16, 18. For example, the columns can be coupled with and extend from the plate 16 to the opposing plate 18 (and be coupled with the plate 18). The columns 600 can prevent the plates 16, 18 from moving toward each other or reduce the distance by which the plates 16, 18 move toward each other (e.g., relative to or compared to the plates 16, 18 not being coupled with the columns 600 or having the columns 600 disposed between the plates 16, 18). For example, a vacuum or other low-pressure environment can be established within the vapor chambers 20 and/or 24. The columns 600 can prevent the plates 16, 18 from collapsing inward or toward each other.

Figure 7:
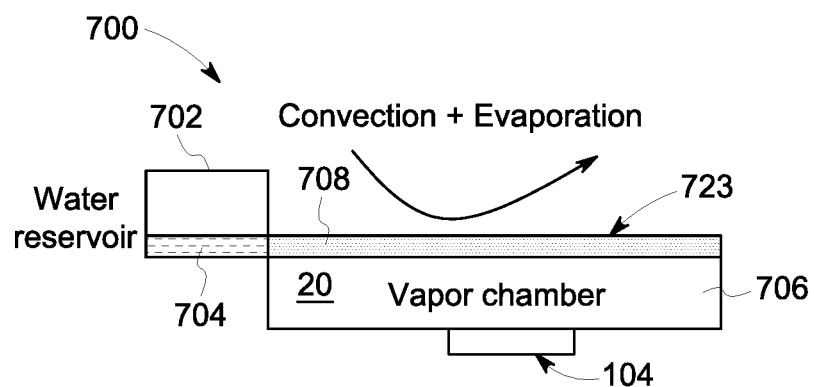
FIG. 7 schematically illustrates another embodiment of a vapor chamber assembly.
Figure 8:
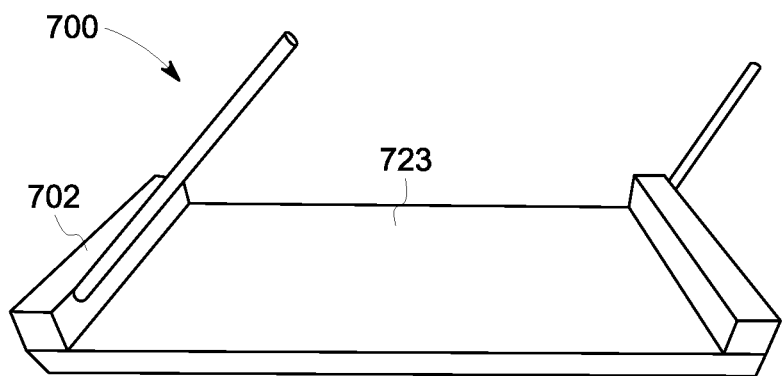
FIG. 8 illustrates a perspective view of the vapor chamber assembly shown in FIG. 7.
Figure 9:
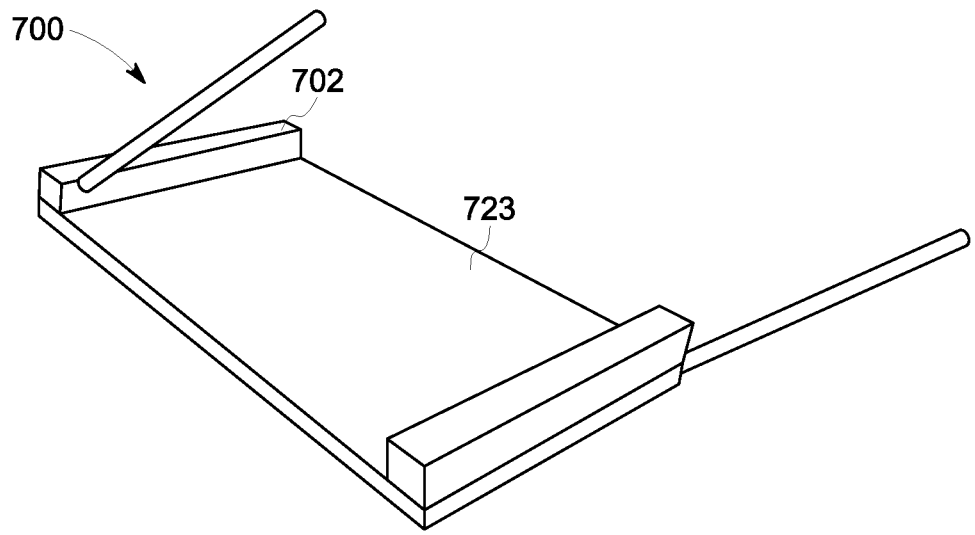
FIG. 9 illustrates another perspective view of the vapor chamber assembly shown in FIGS. 7 and 8.

FIG. 7 schematically illustrates another embodiment of a vapor chamber assembly 700. FIG. 8 illustrates a perspective view of the vapor chamber assembly 700 shown in FIG. 7. FIG. 9 illustrates another perspective view of the vapor chamber assembly 700 shown in FIGS. 7 and 8. The vapor chamber assembly 700 can be used in place of the vapor chamber assembly 200 shown in FIGS. 2 through 6) to cool the device(s) 100, or can be used to cool another, different device. The assembly 700 can be similar to the assembly 200 in that the assembly 200 includes the vapor chamber 20 that is near or in contact with the component 104 of the electronic device 100. The vapor chamber 20 can include the porous interior wick lining 23 described above, even though the interior wick lining 23 is not shown or visible in FIGS. 7 through 9.

One difference between the assemblies 200, 700 is that the assembly 700 includes an exterior porous wick lining or structure 723 disposed outside of the vapor chamber 20. This exterior wick lining 723 can be outside of the vapor chamber 20 in that the vapor inside the chamber 20 (and the liquid that is formed by condensation of the vapor in the chamber 20 and/or is vaporized to form the vapor in the chamber 20) does not come into contact with the exterior wick lining 723. The exterior wick structure or lining 723 operates as an evaporator while the ambient environment (e.g., outside air) is of sufficiently low humidity (e.g., for coolant, such as water, in the exterior lining 723 to evaporate from the lining 723).

The exterior lining 723 can be additively manufactured to be part of the exterior walls of the vapor chamber or can be separately formed and later added to the exterior walls. The exterior walls to which the lining 723 is coupled or part of can be planar or non-planar (e.g., have dimples), as described below. The thickness of the exterior lining 723 can be constant (e.g., within manufacturing tolerances), or may be non-uniform (e.g., intentionally different or varying by more than the manufacturing tolerances) at different locations through the exterior lining 723. As described below, a non-uniform thickness of the exterior lining 723 can improve the transfer of heat through the lining 723 relative to exterior linings that have a uniform thickness. The sizes of the pores in the exterior lining 723 (and/or coolant permeability through the exterior lining 723) can be constant (e.g., within manufacturing tolerances), or may be non-uniform (e.g., intentionally different or varying by more than the manufacturing tolerances) at different locations through the exterior lining 723. As described below, non-uniform pore sizes in the exterior lining 723 can improve the movement of coolant through the lining 723 relative to exterior linings that have a uniform pore size.

The assembly 700 can include a coolant reservoir chamber 702 that holds a supply of coolant 704 (e.g., water). The exterior wick structure 723 and reservoir chamber 702 can be created (along with the vapor chamber 20 and interior wick structure 23) using additive manufacturing. The reservoir chamber 702 is fluidly and/or fluidically coupled with the exterior wick structure or lining 723 such that at least some coolant 704 in the reservoir chamber 702 can flow (via capillary action or force) into pores 708 in the exterior wick structure 723. These pores 708 can hold the liquid phase of the cooling fluid. Although not shown, the interior wick structure also may include pores 708 to hold the liquid phase of the working fluid. The reservoir chamber 702 can be replenished with cooling fluid from condensation from the atmosphere (e.g., via condensation of water vapor) and/or from another source (e.g., a larger chamber storing liquid coolant 704). In one embodiment, the reservoir chamber 702 is a passive chamber or reservoir that is at least partially filled with cooling fluid from condensation of humidity from the ambient atmosphere. Alternatively, the reservoir chamber 702 can be fed with cooling fluid from one or more active (e.g., powered) pumps.

An impermeable wall 706 can be disposed between the interior and exterior wick structures 23, 723 to prevent coolant from passing from one wick structure 23 or 723 to the other wick structure 723 or 23. The working fluid held in the pores 708 of the interior wick structure 23 may be the same or different from the cooling fluid held in the pores 708 of the exterior wick structure 723.

In operation, at least some of the heat (e.g., thermal energy) in the vapor chamber 20 is transferred into the exterior wick structure 723. This heat vaporizes the liquid coolant in the exterior wick structure 723, which transfers this heat out of the exterior wick structure 723 and away from the assembly 700 and the device 100. Liquid coolant 704 in the reservoir chamber 702 flows through capillary action into the pores in the exterior wick structure 723. This liquid coolant in the exterior wick structure 723 can then be vaporized and evaporate to further dissipate heat from the assembly 700 and device 100 via both convection and evaporation. This results in the exterior wick structure 723 dissipating more thermal energy from the device 100 and/or dissipating the thermal energy from the device 100 at a faster rate than vapor chamber assemblies that do not include the exterior wick structure 723.

Figure 10:
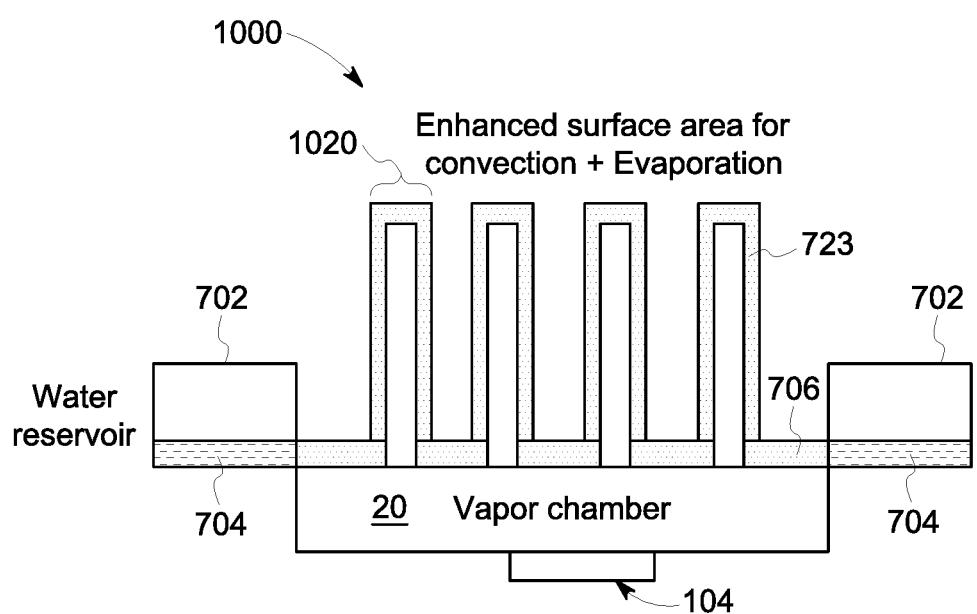
FIG. 10 schematically illustrates another embodiment of a vapor chamber assembly.

FIG. 10 schematically illustrates another embodiment of a vapor chamber assembly 1000. The vapor chamber assembly 1000 can be similar to the vapor chamber assemblies 200 and/or 700. For example, the vapor chamber assembly 1000 can include the internal vapor chamber(s) 20, the interior wick lining 23, the exterior wick lining 723, and/or the reservoir chamber 702. One difference between the vapor chamber assembly 1000 and the vapor chamber assembly 700 is the addition of several surface area enhancement structures 1020 of the interior vapor chamber(s) 20. These structures 1020 can include elongated extensions of the vapor chamber 20 such that vapor can flow between and/or among the vapor chamber 20 and the structures 1020. In one embodiment, the structures 1020 include elongated and/or planar fins. As shown in FIG. 10, the exterior wick lining 723 is disposed on and outside of the impermeable wall 706 such that no coolant is able to pass between the interior and exterior wick linings 23, 723. The structures 1020 increase the surface area over which the interior and exterior wick linings 23, 723 are disposed. This increased surface area can further increase the effectiveness of the assembly 700 in cooling the component 104 (e.g., relative to the assembly 200).

The impermeable walls forming the vapor chambers 20, 24 in the vapor chamber assemblies 100, 200, 700 can be relatively thin. For example, the thickness of the impermeable walls 706 that are adjacent to the interior and/or exterior wick structures 23, 723 can be several orders of magnitude less than the largest dimensions of the walls 706 in one or more directions that are perpendicular to the direction in which the thickness of the wall 706 is measured. As a result, these thin walls 706 can extend over very large two-dimensional planes, but over very small distances in a third dimension. If the walls 706 are formed using additive manufacturing, the walls 706 may become buckled, warped, or otherwise out-of-plane due to the thinness of the walls 706 and the residual stresses resulting from additive manufacturing. The buckling or warping of the walls 706 may not be able to be controlled and/or may not be repeatable in a manufacturing environment. Consequently, it can be difficult to manufacture many vapor chamber assemblies having consistent performance in transferring heat away from components 104 in electronic devices 100.

For example, the vapor chambers 20 can have thin hermetic plates 16, 18 so that heat can more easily pass into the vapor chamber 20 (e.g., relative to thicker plates 16, 18). As the thickness of the plates 16, 18 increases, it becomes more difficult to transfer thermal energy into the chamber 20. Because there also may be a need to have a large surface area for each of the plates 16, 18 for removing heat, the resulting plates 16, 18 can be large, thin-walled surfaces that are additively manufactured (e.g., using 3D printing). This can be difficult to precisely form using additive manufacturing. For example, a vapor chamber 20 that measures eighty millimeters by forty millimeters by three millimeters thick may have plates 16, 18 that are 300 microns thick (or less), and may have buckling in one or more of the plates forming the vapor chamber 20 due to residual stresses.

The inventors of the inventive subject matter described herein have discovered that creating the plates or walls of a vapor chamber 20 to be non-planar (e.g., not a by-product of the additive manufacturing) can result in the non-planar plates or walls having less irregular, uncontrolled, or unplanned deformations (e.g., buckling) due to reduced residual stresses (relative to attempting to form planar or flat plates or walls.

Figure 11:
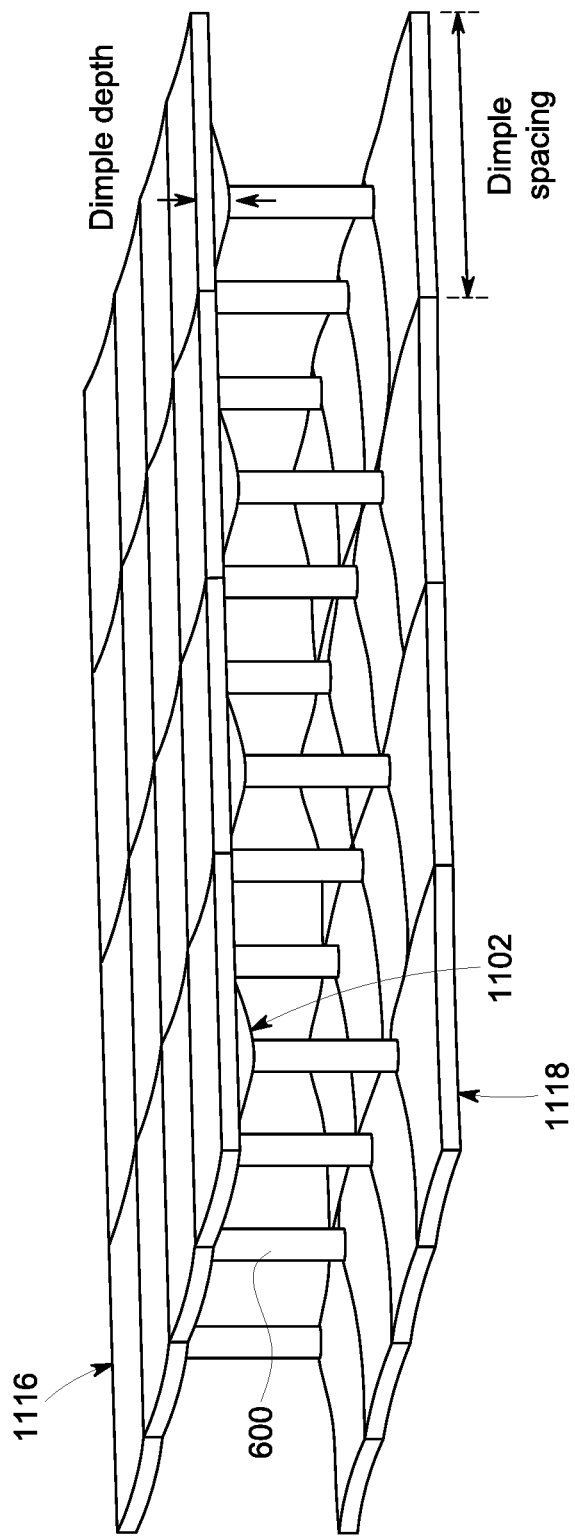
FIG. 11 illustrates a perspective view of one embodiment of opposing plates and support columns of a vapor chamber of a vapor chamber assembly.
Figure 12:
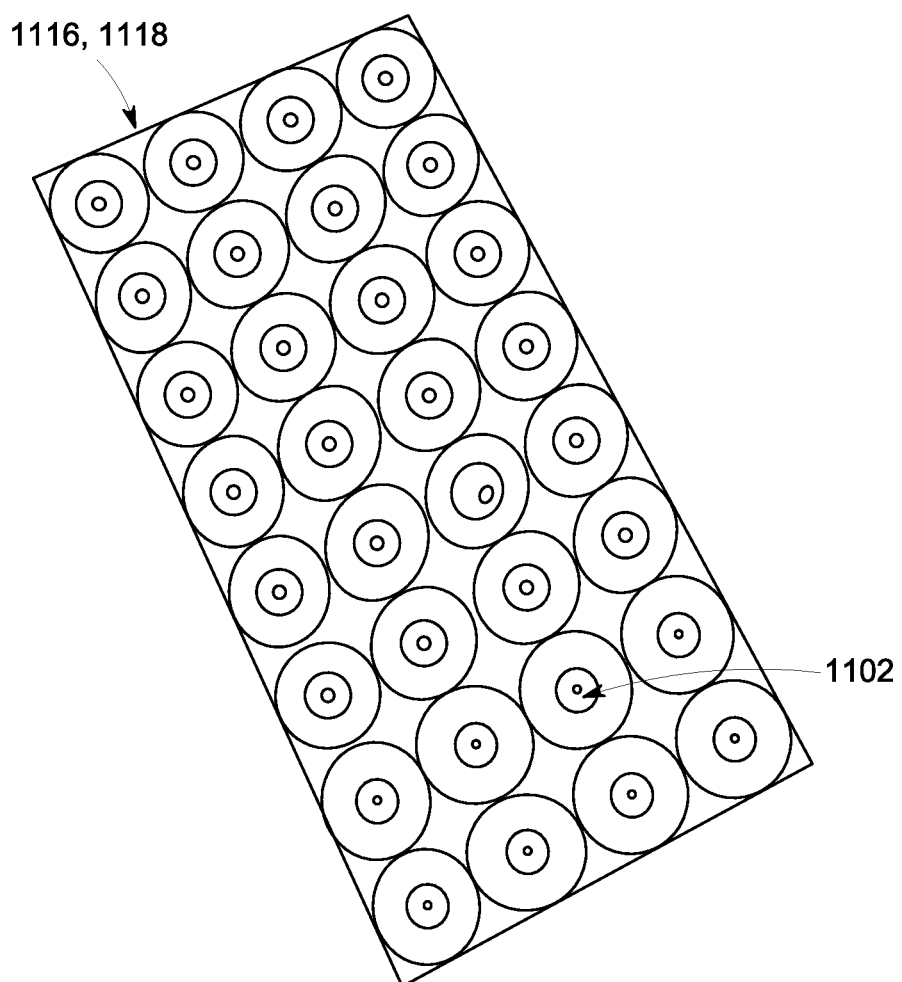
FIG. 12 illustrates another perspective view of one of plates shown in FIG. 11.

FIG. 11 illustrates a perspective view of one embodiment of opposing plates 1116, 1118 and columns 1100 of a vapor chamber 20 of the vapor chamber assembly 1000, 200, 700. FIG. 12 illustrates another perspective view of one of the plates 1116 or 1118 shown in FIG. 11. The plate 1116 can be used in place of the plate 16, the plate 1118 can be used in place of the plate 18, and/or the columns 1100 can be used in place of the columns 600 described above. One difference between the plates 1116, 1118 and the plates 16, 18 is that the plates 16, 18 are planar bodies while the plates 1116, 1118 are non-planar bodies. For example, the plates 16, 18 extend in first and second perpendicular directions (e.g., along x- and y-directions or axes) much larger distances (e.g., several orders of magnitude) than the plates 16, 18 extend in a third perpendicular direction (e.g., along a z-direction or axis), without undulations, curves, dimples, or the like (e.g., protrusions), extending into and/or out of a plane defined by the first and second perpendicular directions. Conversely, the plates 1116, 1118 extend in the first and second perpendicular directions much larger distances than the plates 1116, 1118 extend in a third perpendicular direction, but with undulations, curves, dimples, or the like, extending into and/or out of a plane defined by the first and second perpendicular directions.

In the illustrated embodiment, each plate 1116, 1118 includes protrusions 1102 that extend away from the plane primarily defined by the plate 1116, 1118 toward the other plate 1118, 1116. For example, the plate 1116 includes protrusions such as dimples having pyramidal, conical, or the like, shapes that extend out of the plane of the plate 1116 toward the opposite plate 1118, while the plate 1118 includes dimples having the same or similar shapes that extend out of the plane of the plate 1118 toward the opposite plate 1116. The protrusions 1102 can differ from unintended buckling or other undulations created by residual stresses formed during the additive manufacturing process for creating the plates 1116, 1118 in that the protrusions 1102 can be arranged in a regularly spaced (e.g., repeating) grid, pattern, or arrangement. The grid, pattern, or arrangement may be repeating in that the same grid, pattern, or arrangement of the protrusions 1102 appears several times with the same spacing between the protrusions 1102 in each repeated occurrence of the grid, pattern, or arrangement. Alternatively, the protrusions 1102 can be arranged in a random (e.g., non-repeating) arrangement, a rectangular repeating arrangement, a hexagonal repeating arrangement, or a mixture thereof. The protrusions 1102 may all have the same size, or two or more (or all) of the protrusions 1102 may have different sizes and/or shapes.

Figure 13:
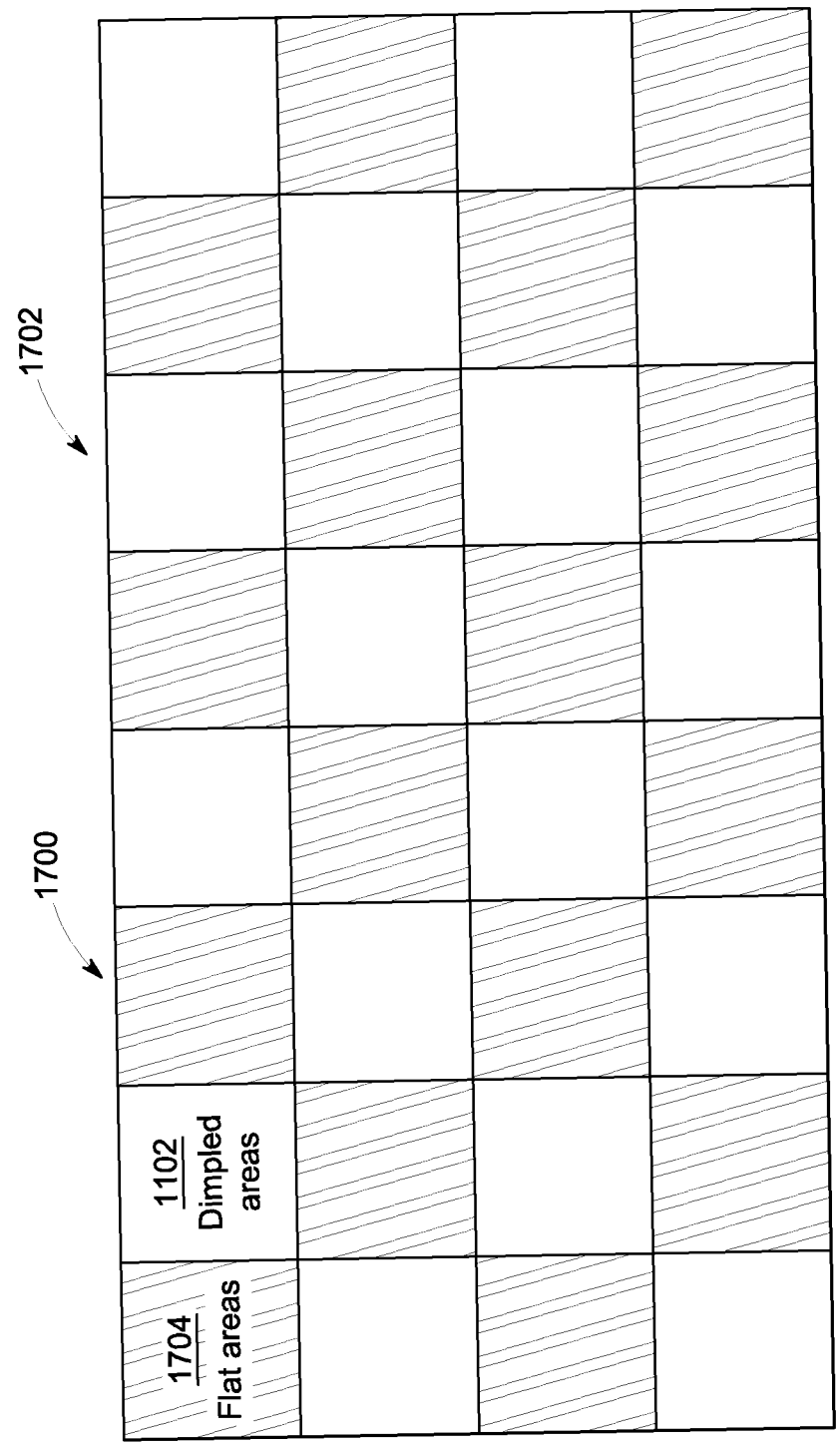
FIG. 13 schematically illustrates interspersed patterns of protrusions and non-protrusion areas for one example of a plate.
Figure 17:
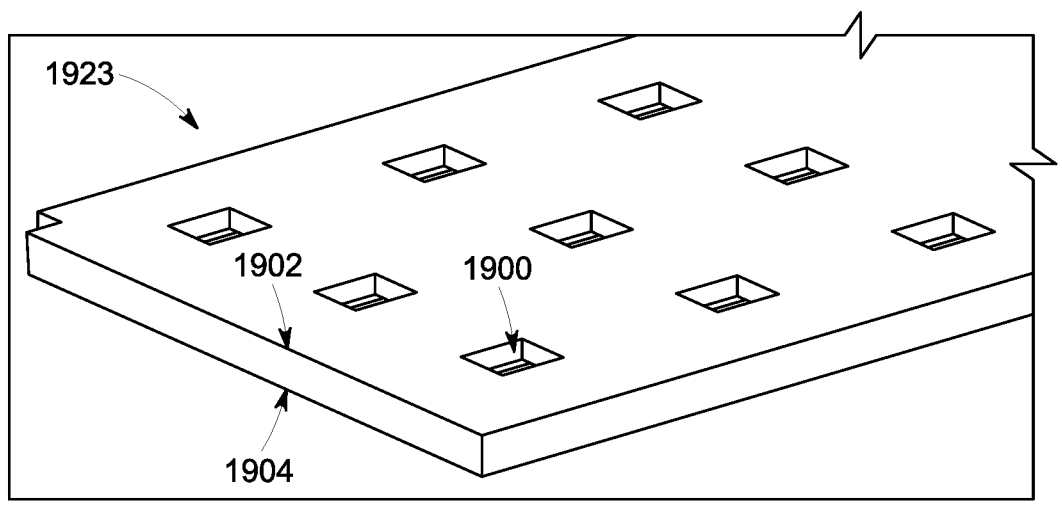
FIG. 17 illustrates a perspective view of an alternative embodiment of a wick structure.

The repeating pattern in which the protrusions 1102 are formed can include a repeating pattern of spaces in the plate 1116, 1118 having no protrusions 1102. For example, the plate 1116 and/or 1118 can be formed from a repeating pattern that is formed from a first repeating pattern of protrusions 1102 interspersed with a second repeating pattern of spaces. FIG. 13 schematically illustrates interspersed patterns 1700, 1702 of protrusions 1102 and non-protrusion areas 1704 for one example of a plate, such as the plate 1116 and/or 1118. The patterns 1700, 1702 represent the relative spacing of locations where protrusions 1102 are located and locations where no protrusions 1102 are located. The spaces (e.g., boxes) indicated by the pattern 1700 represent where protrusions 1102 are located, while the spaces in the pattern 1702 represent where no protrusions 1102 are located (e.g., the non-protrusion areas 1704). As shown in FIG. 17, both the patterns 1700, 1702 of protrusions 1102 and non-protrusions areas 1704 are mixed, or interspersed with each other over the plate. This interspersing of the patterns 1700, 1702 can improve thermal contact with the hot component 104 due to the potential for increased surface area contact between the component 104 and the plate (relative to not having the pattern 1702 of the non-protrusion areas 1704 in the plate).

The protrusions 1102 can have any of a variety of shapes and/or sizes that protrude out of the plane in which the plate 1116, 1118 otherwise is located (e.g., aside from the protrusions 1102, the plate 1116, 1118 is within and/or defines the plane). For example, the protrusions 1102 can have the shape of a peak of a cone, the peak of a pyramid, a square shape, a circular shape, a hexagonal shape, a rectangular shape, an oval shape, or the like. These types of protrusions 1102 can be referred to as two-dimensional protrusions as the protrusions 1102 have a width dimension and a depth dimension. The width dimension of a protrusion 1102 can be measured in directions that are parallel to the plane of the rest of the corresponding plate 1116 or 1118. The depth dimension can be measured in a direction that is perpendicular to the plane of the corresponding plate 1116 or 1118.

In the illustrated embodiment, the protrusions 1102 each separately extend inward and converge toward a different column 600. For example, each protrusion 1102 extending from the plate 1116 toward the plate 1118 may converge toward a point or location that is on or within a different column 600 than all other protrusions 1102 extending from the same plate 1118. Similarly, each protrusion 1102 extending from the plate 1118 toward the plate 1116 may converge toward a point or location that is on or within a different column 600 than all other protrusions 1102 extending from the same plate 1118. While the protrusions 1102 on the same wall or plate 1116, 1118 are shown as all extending in a common direction, alternatively, some protrusions 1102 may extend from a wall or plate 1116 or 1118 in one direction while other protrusions 1102 in the same wall or plate 1116 or 1118 may extend in an opposite direction.

Figure 14:
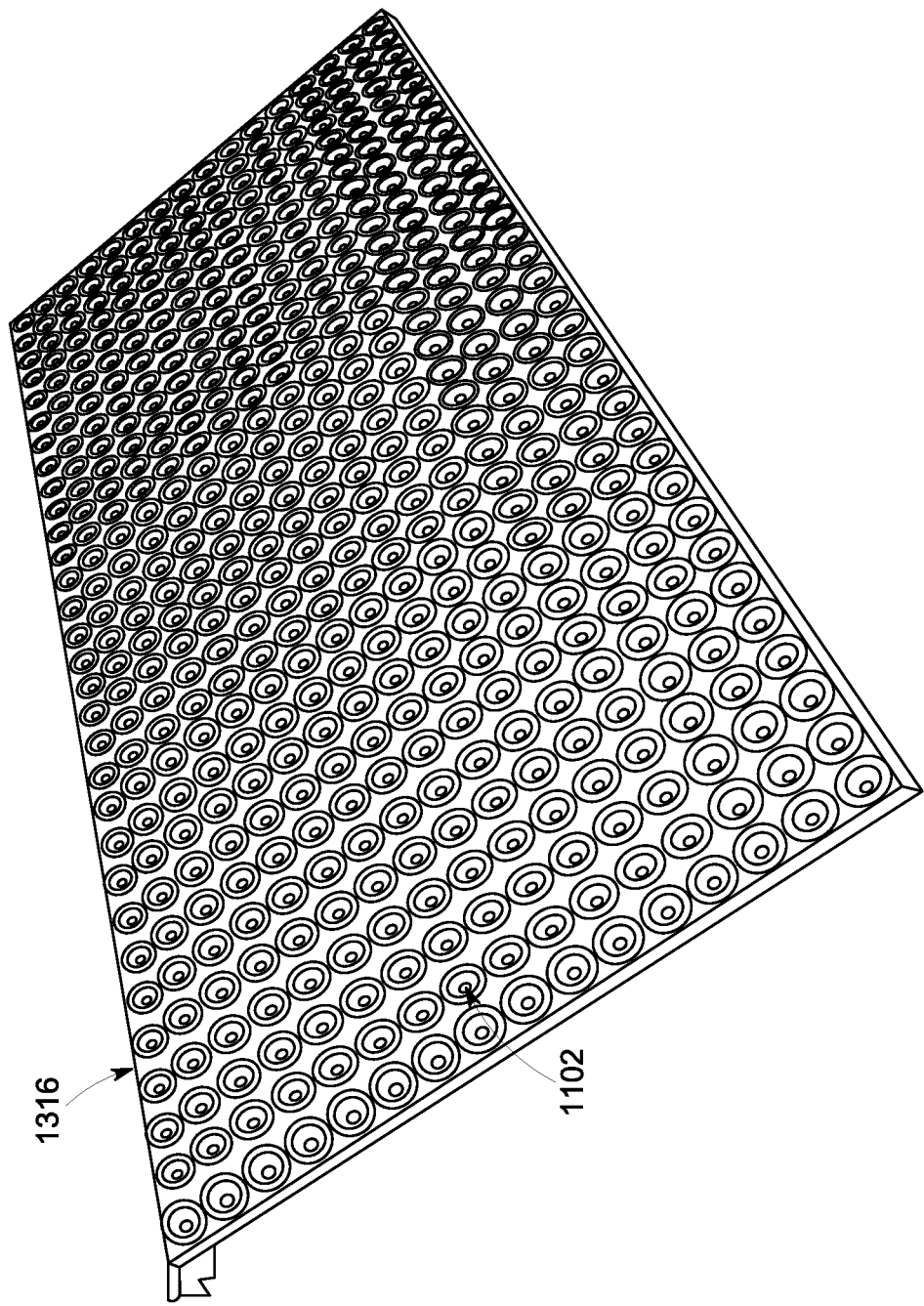
FIG. 14 illustrates a perspective view of a plate having protrusions with different parameters than the protrusions shown in FIGS. 11 and 12.

The protrusions 1102 can be defined by one or more parameters. These parameters dictate relative locations of the protrusions 1102, sizes of the protrusions 1102, how many protrusions 1102 are within a designated unit area of a plate 1116, 1118, the shapes of the protrusions 1102, etc. These parameters can dictate the operating settings of the additive manufacturing process used to fabricate the plates 1116, 1118. One such parameter is a spacing between the protrusions 1102. The spacing can be the distance between the same location on adjacent or neighboring protrusions 1102. Optionally, the spacing can be represented as a frequency at which the protrusions 1102 are repeated (e.g., as a function of distance along one or more directions in the plane defined by the remainder of the plate 1116, 1118 that does not include the protrusions 1102). Another parameter can be the depth of the protrusions 1102, such as how far the protrusions 1102 extend from the plane defined by the remainder of the plate 1116, 1118 that does not include the protrusions 1102. FIG. 14 illustrates a perspective view of a plate 1316 having protrusions 1102 with different parameters than those protrusions 1102 shown in FIGS. 11 and 12. The plate 1316 can be used in place of the plate 1116 or 1118 in a vapor chamber 20. Another parameter can be the shape of the protrusions 1102, such as pyramidal, conical, etc.

Figure 15:
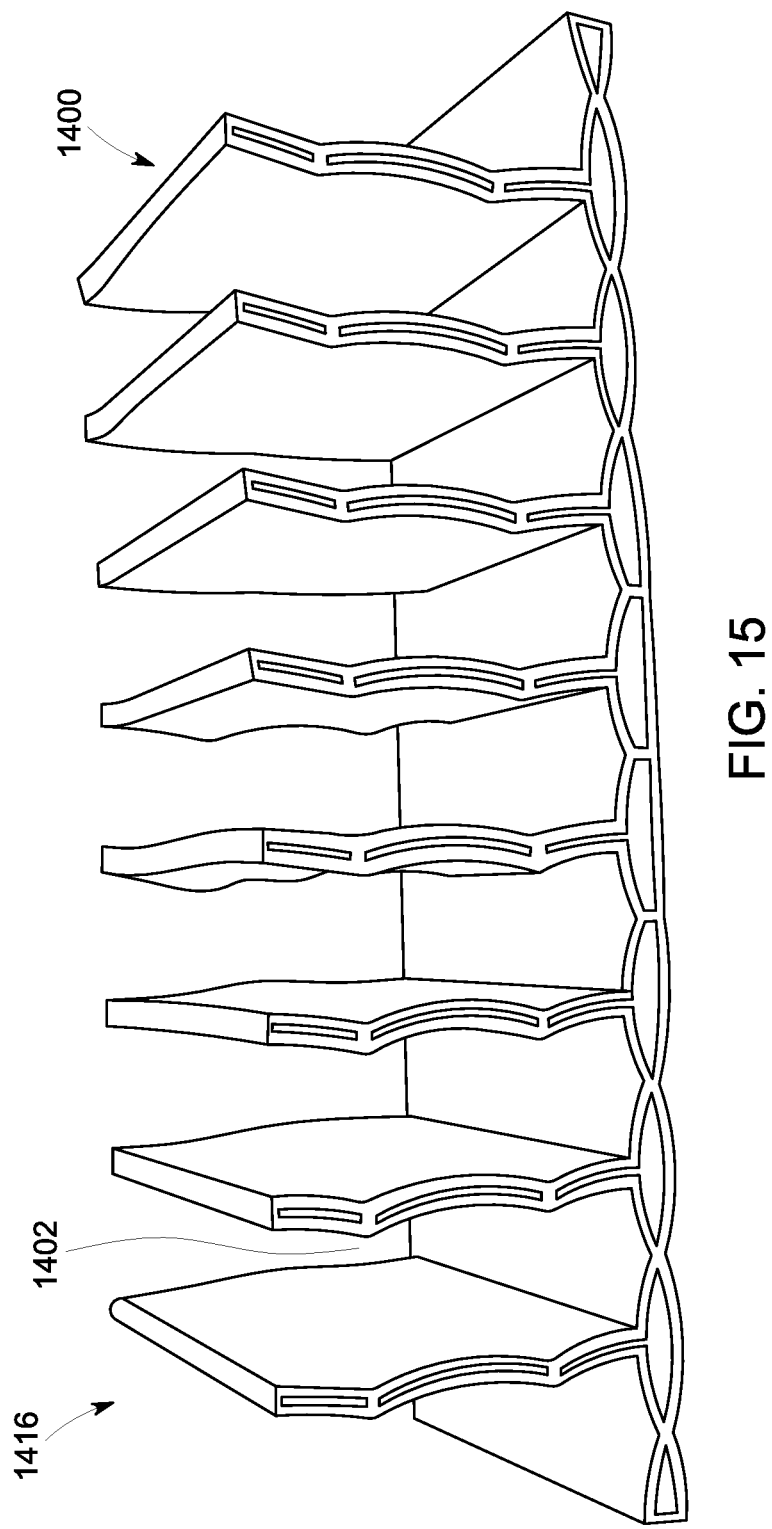
FIG. 15 illustrates one embodiment of a plate having several surface area enhancement structures with protrusions.

While the protrusions 1102 are shown as two-dimensional shapes, optionally, the protrusions 1102 can have a one-dimensional shape. For example, instead of having a cone or pyramid shape, the protrusions 1102 can be formed as waves (e.g., sinusoidal) waves extending out of one or both sides of the corresponding plate 1116, 1118. The parameters of such a one-dimensional shape can be the frequency, amplitude, phase, or the like, of the one-dimensional wave. FIG. 15 illustrates one embodiment of a plate 1416 having several fins 1400 having one-dimensional protrusions 1402. The plate 1416 can be used in place of the plate 16, 18 in a vapor chamber assembly. The fins 1400 can be inside the vapor chamber 20 or can be the structures 1020 shown in FIG. 10.

Additionally, the protrusions 1102 in the plates 1116, 1118 shown in FIG. 11 are out of phase with each other. The peaks of the protrusions 1102 in each plate 1116, 1118 extend toward or point toward corresponding protrusions 1102 in the other plate 1116, 1118. Alternatively, the protrusions 1102 can be in phase with each other, such that the protrusions 1102 that are opposite each other in the plates 1116, 1118 extend or point toward the same direction. For example, a first protrusion 1102 in the plate 1118 may point or extend toward the plate 1116 and a second protrusion 1102 in the plate 1116 that is opposite the first protrusion 1102 in the plate 1118 may point or extend away from the plate 1118. A third protrusion 1102 in the plate 1116 may point or extend toward the plate 1118 and a fourth protrusion 1102 in the plate 1118 that is opposite the third protrusion 1102 in the plate 1116 may point or extend away from the plate 1116.

The value(s) used for the parameters of the protrusions 1102 can be based on the size of the plate 1116, 1118 that will include the protrusions 1102. For example, larger plates 1116, 1118 (e.g., having greater surface areas within the two-dimensional plates of the plates 1116, 1118) may have smaller spacings between the protrusions 1102, larger frequencies at which the protrusions 1102 are repeated, larger depths of the protrusions 1102, or the like, relative to smaller plates 1116, 1118 (e.g., smaller surface areas within the two-dimensional plates of the plates 1116, 1118).

The parameters that define the dimples (protrusions 1102) can be varied to provide for a wide variety of shapes, sizes, and/or arrangements of the bodies having the dimples. In one embodiment, the depth or size of the protrusions 1102 can be controlled as to reduce the likelihood of buckling, such as by increasing the ratio of the height or depth of the protrusion 1102 to the width of the protrusion 1102. Placing or forming the protrusions 1102 closer together can result in stiffer bodies that include the protrusions 1102 (relative to the bodies including the protrusions 1102 being spaced farther apart from each other.

The size of the protrusions 1102 can be different at different locations on a surface from which the protrusions 1102 extend. For example, neighboring protrusions 1102 may be differently sized such that larger protrusions 1102 may be adjacent to smaller protrusions. The cross-sectional shapes of the protrusions 1102 dimple can be a variety of shapes and/or sizes, such as conical, sinusoidal, or the like. In one embodiment, the cross-sectional shapes of the protrusions 1102 are not circumferentially continuous. For example, the protrusions 1102 can include facets or other planar surfaces joined by edges.

While the description herein focuses on the plates 1116, 1118 on which or in which the protrusions 1102 are formed being two-dimensional (e.g., planar or otherwise flat)

shapes, not all embodiments of the inventive subject matter are limited to this. Alternatively, the protrusions 1102 can be formed on curved surfaces, cylindrical surfaces, or the like, that are formed using additive manufacturing. The formation of the protrusions 1102 can reduce residual stresses in a variety of additively manufactured bodies to maintain the intended or designed shape of the bodies, while reducing or eliminated unintended buckling or other deformations. In one embodiment, the exterior porous wick structure or lining 723 can be formed to include the protrusions 1102 described herein. This can assist with the transfer or dissipation of thermal energy via the increased surface area of the exterior structure 723 (relative to an exterior structure 723 that does not include the protrusions 1102).

In some additive manufacturing processes, vapor chambers and the walls forming the vapor chambers are created using uniform parameters. For example, the additive manufacturing process may be used to create walls of the vapor chambers having a uniform thickness (e.g., within manufacturing tolerances) and/or uniform pore sizes in the walls or linings of the walls. In one embodiment of the inventive subject matter described herein, however, the vapor chambers and/or wick structures can be formed with non-uniform thicknesses and/or pore sizes. For example, the operating parameters of the additive manufacturing process can be varied with respect to time and/or location during the manufacture of the walls or plates, wick structures, etc. The operating parameters can include the size of the particles used to create the additive-manufactured body, the power of the laser light used to weld the particles together, the duration at which the laser light is exposed to the particles, or the like.

This varying of the operating parameters can result in a non-uniform thickness of the plates 16, 18, 1116, 1118, 1316, 1416 and/or the wick structures 23, 723, and can result in a non-uniform distribution of pore sizes within the plates 16, 18, 1116, 1118, 1316, 1416 and/or the wick structures 23, 723. The thicknesses of the plates and/or wick structures can be non-uniform in that the thicknesses are either controlled to be different at different locations by more than the manufacturing tolerance of the additive manufacturing process or are not controlled to be different at different locations by more than the manufacturing tolerance of the additive manufacturing process, but end up being different by more than the manufacturing tolerance of the additive manufacturing process.

Figure 16:
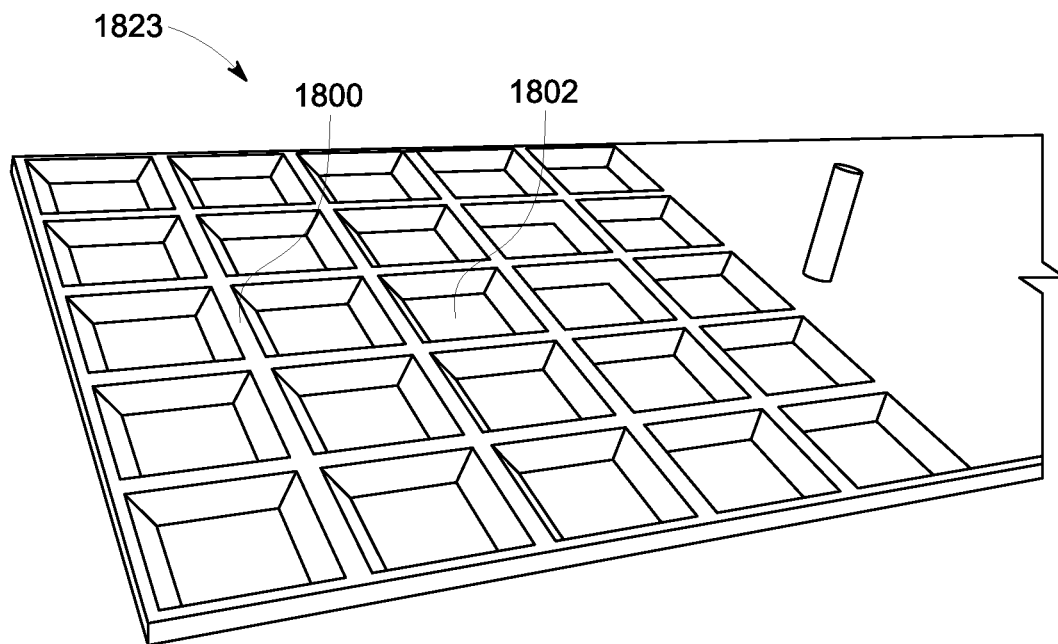
FIG. 16 illustrates one embodiment of a wick structure having a non-uniform thickness.

FIG. 16 illustrates one embodiment of a wick structure 1823 having a non-uniform thickness. The wick structure 1823 can represent one or more of the wick structures described herein. The wick structure 1823 can be formed using additive manufacturing or another technique. The wick structure 1823 includes thicker domains or areas 1800 and thinner domains or areas 1802. As shown, the thicker areas 1800 separate the thinner areas 1802 from each other. The arrangement of the thicker and thinner areas 1800, 1802 shown in FIG. 16 is but one example. Alternatively, another arrangement may be used, such as a random interspersing of the thicker and thinner areas 1800, 1802 among each other, a rectangular array, a hexagonal array, etc.

The use of a non-uniform thickness such as shown in FIG. 16 can improve heat flow, working fluid flow, and heat transfer performance of the wick structure 1823 relative to a wick structure that has a constant thickness (e.g., within manufacturing tolerances). The patches of flat, thin walls forming the thinner areas 1802 allow for increased efficiency in the flow of heat through the thickness of the wick structure 1823 relative to a thicker wick structure. The thicker walls forming the thicker areas 1800 are located between the thinner areas 1802 and operate by feeding the working fluid to the thinner areas 1802. For example, the thicker areas 1800 can hold more working fluid than the thinner areas 1802 and can provide this working fluid to the thinner areas 1802 as the working fluid in the thinner areas 1802 is vaporized during operation, as described herein.

Similarly, the pore sizes (or sizes of voids) in the plates and/or wick structures are either controlled to be different at different locations by more than the manufacturing tolerance of the additive manufacturing process or are not controlled to be different at different locations by more than the manufacturing tolerance of the additive manufacturing process, but end up being different by more than the manufacturing tolerance of the additive manufacturing process. The pore sizes can be non-uniform in three-dimensions or directions. For example, pore sizes may vary along a width direction, along a length direction, and/or along a thickness or height direction in the wick structures 23, 723.

Making the thicknesses and/or pore sizes have a non-uniform distribution in a plate and/or wick structure can improve the efficiency by which the plate and/or wick structure transfers thermal energy. The non-uniform thicknesses and/or pore sizes can allow for working fluid (e.g., water) to more easily move through the porous microstructure of the plates and/or wick structures. More uniform pore sizes (e.g., only larger pores) can result in the working fluid moving easily through the wick structure, but also reduces the capillary forces that pull the cooling liquid through the wick structure. A wick structure having both small pores for the greater capillary forces and larger pores for a more efficient flow of working fluid through the porous wick structure can provide improved cooling. With respect to non-uniform thicknesses, a wick structure that is thin in some locations (e.g., the area where evaporation occurs) allows for improved evaporation of the working fluid (relative to thicker wick structures).

Figure 18:
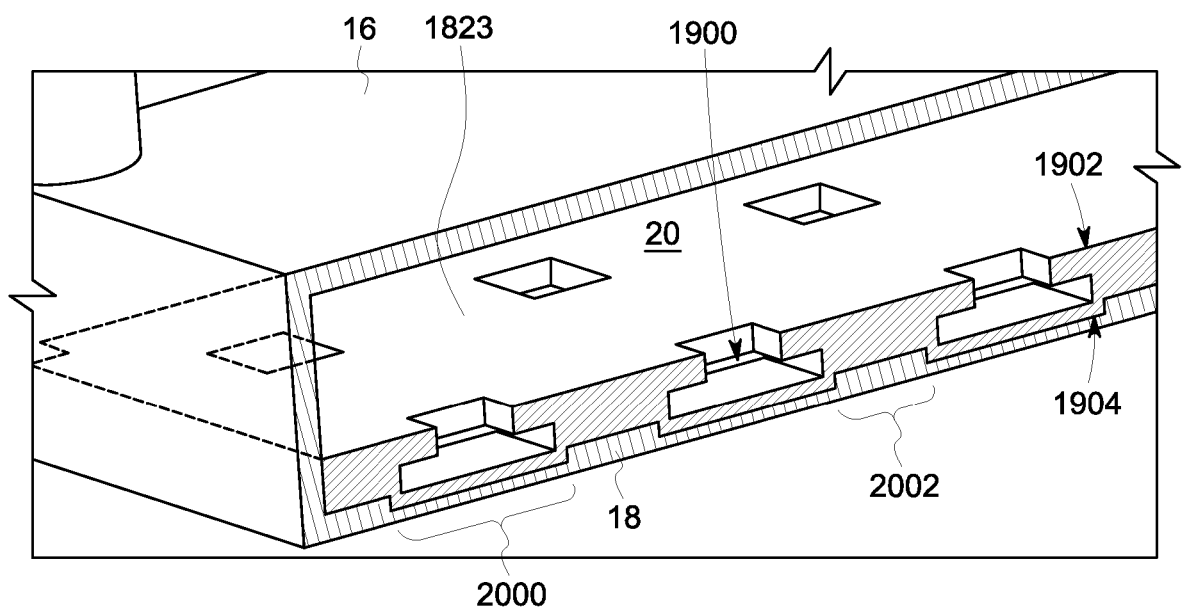
FIG. 18 illustrates a cross-sectional view of the wick structure shown in FIG. 17 inside the vapor chamber shown in FIGS. 5 and 6.
Figure 20:
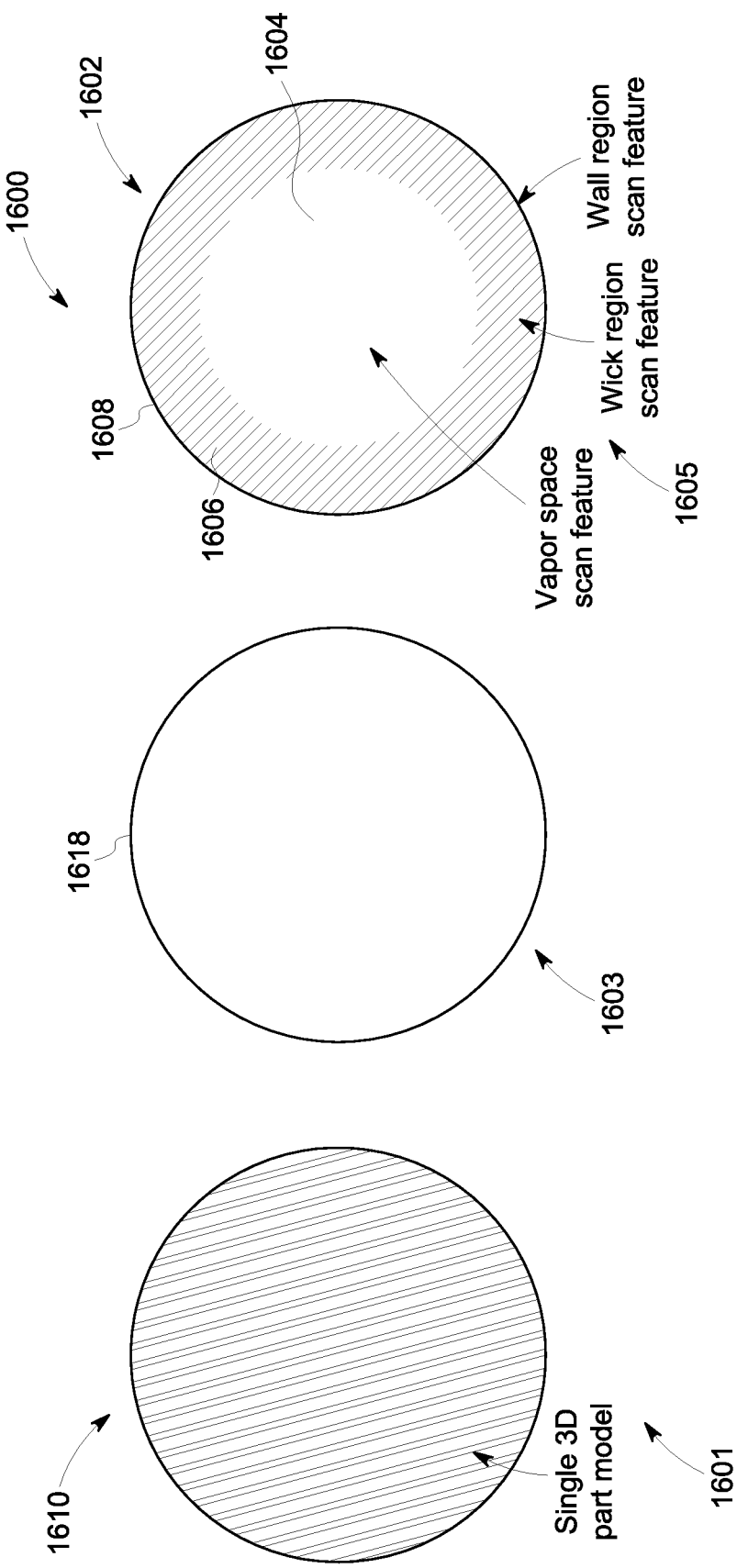
FIG. 20 illustrates one example of a method for performing additive manufacturing of a cylindrical vapor chamber assembly using a computerized three-dimensional printing system.

FIG. 17 illustrates a perspective view of an alternative embodiment of a wick structure 1923. FIG. 18 illustrates a cross-sectional view of the wick structure 1923 shown in FIG. 17 inside the vapor chamber 20 shown in FIGS. 5 and 6. In contrast to other wick structures shown and described herein, the wick structure 1923 includes vents 1900 that extend into and/or through the thickness of the wick structure 1923. The vents 1900 are holes or openings into the wick structure 1923. In one embodiment, the vents 1900 extend only into the wick structure 1923, but not all the way through the thickness of the wick structure 1923. As shown in FIG. 20, the vents 1900 can extend through the majority, but not all, of the thickness of the wick structure 1923. Alternatively, one or more, or all, of the vents 1900 extend through the entire thickness of the wick structure 1923. For example, the vents 1900 may form conduits having openings at each of the opposite sides of the wick structure 1923.

The vents 1900 provide additional surface areas for the vaporized working fluid to escape from the wick structure 1923 as the wick structure 1923 receives thermal energy. The vents 1900 also provide additional surface areas for the vaporized working fluid in the atmosphere or volume of the vapor chamber 20 to condense and form liquid coolant that flows into the wick structure 1923.

The thickness of the wick structure 1923 can be thinner in locations 2000 where the vents 1900 are located and thinner in other locations 2002 between the vents 1900. As described above, this can assist with the transfer of heat through the wick structure 1923 and/or with the transfer of working fluid through the wick structure 1923 (relative to a wick structure that does not include the different thicknesses).

The sizes of the pores in the wick structure 1923 also can be non-uniform through the thickness of the wick structure 1923. For example, the pore sizes can be smaller in locations that are closer to one side 1902 of the wick structure 1923 and larger in locations that are farther from the side 1902 or closer to an opposite side 1904 of the wick structure 1923. The side 1902 with the smaller pore sizes can be facing the interior of the vapor chamber 20 while the opposite side 1904 with the larger pore sizes can face the plate 16, 18 that is closest to the wick structure 1923. The smaller pore sizes can provide greater acceleration resistance to the flow of the working fluid through the wick structure 1923, while the larger pore sizes can provide lower flow resistance to the flow of the working fluid through the wick structure 1923.

Figure 19:
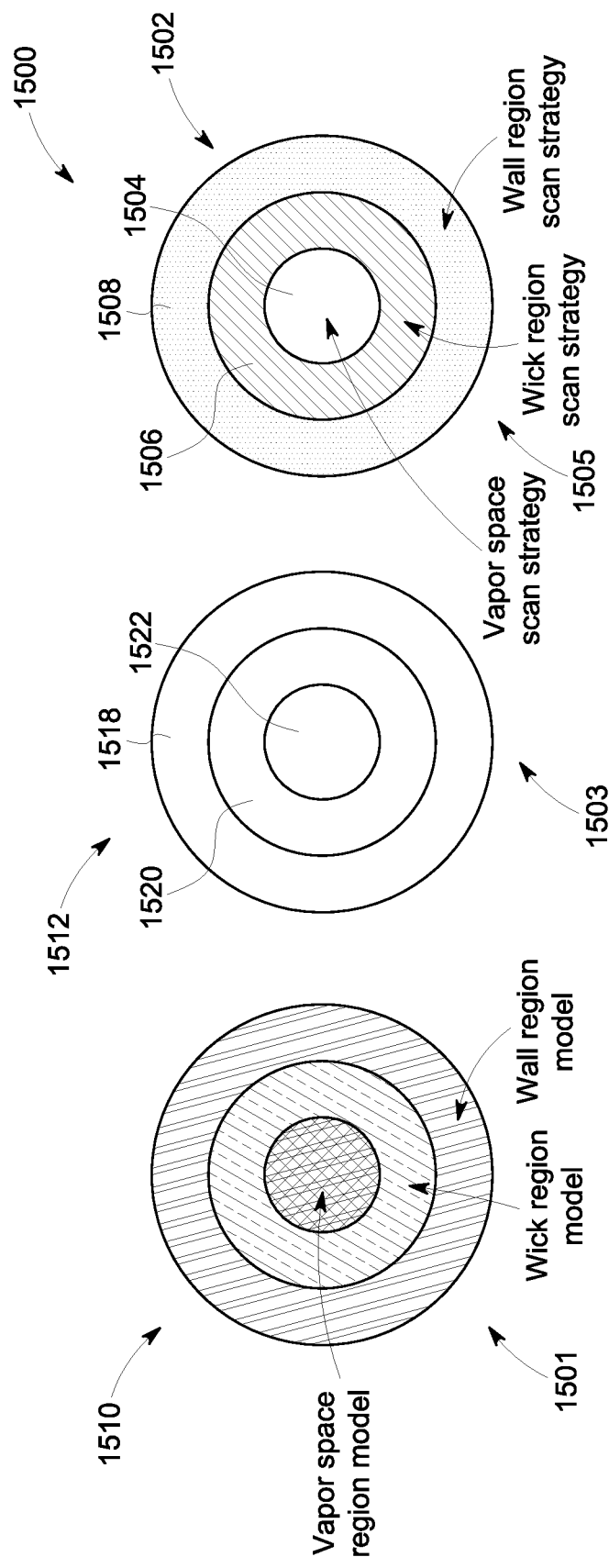
FIG. 19 illustrates one example of a method for performing additive manufacturing of a cylindrical vapor chamber assembly using a computerized three-dimensional printing system.

FIG. 19 illustrates one example of a method 1500 for performing additive manufacturing of a cylindrical vapor chamber assembly 1502 using a computerized three-dimensional printing system. The vapor chamber assembly 1502 can be formed using three-dimensional printing. As shown, the vapor chamber assembly 1502 has a cylindrical shape with an open interior chamber 1504 surrounded by an interior wicking structure or lining 1506, which is surrounded by a wall 1508. The method 1500 can include creating (at 1501) a three-dimensional model 1510 that defines a vapor space region model, a wick region model, and a wall region model. Each of these models represents an area or volume of the resultant vapor chamber 1502 that is formed using different laser or other printing parameters. Several different domains 1518, 1520, 1522 are mathematically and/or digitally generated by a computing system of the printing system (at 1503) to represent the corresponding models 1512, 1514, 1516. The computing system uses the domains 1518, 1520, 1522 to determine how to additively form the different parts of the vapor chamber assembly 1502. For example, the computing system uses (at 1505) the domain 1518 to determine the laser parameters for laser-welding the metal particles together that form the solid wall 1508, uses the domain 1520 to determine the laser parameters for laser-welding the metal particles together in a porous manner to form the wick structure 1506, and uses the domain 1522 to determine the laser parameters for not laser-welding the metal particles together to form any solid or porous objects in the interior chamber 1504.

Alternatively, in one embodiment of the inventive subject matter described herein, the outer wall of a vapor chamber can be formed using a single pass of the laser of the printing system, thereby forming a very thin hermetically sealed wall. Optionally, the outer wall may also be formed using several overlaying or closely spaced scan paths. The closely spaced scan paths can be on the order of the weld bead width or smaller, such as the scan paths being less than 250 microns from each other.

FIG. 20 illustrates one example of a method 1600 for performing additive manufacturing of a cylindrical vapor chamber assembly 1602 using a computerized three-dimensional printing system. The vapor chamber assembly 1602 can be formed using three-dimensional printing. As shown, the vapor chamber assembly 1602 has a cylindrical shape with an open interior chamber 1604 surrounded by an interior wicking structure or lining 1606, which is surrounded by a very thin hermetic wall 1608 (thin relative to the wall 1508).

The method 1600 can include creating (at 1601) a three-dimensional model 1610 that defines a single model for the entire vapor chamber assembly 1602. In contrast to the several separate models created for the parts of the vapor chamber assembly 1502, the model 1610 created for the vapor chamber assembly 1502 includes only a single, continuous three-dimensional model (as shown in FIG. 20). This single model represents an area or volume of the resultant vapor chamber 1602 that is formed using different laser or other printing parameters.

A single domain 1618 is mathematically and/or digitally generated by a computing system of the printing system (at 1603) to represent the corresponding model 1610. The computing system uses the domain 1618 to determine how to additively form the different parts of the vapor chamber assembly 1602. For example, the computing system uses (at 1605) the domain 1618 to determine the laser parameters for laser-welding the metal particles together that form the hermetic wall 1608. The domain 1618 can dictate that a single laser exposure or pass along the outer edges of the domain 1618 is to be used to form a very thin hermetic wall 1608. The single scan or single model approach can be used to allow more of the technical parameter details regarding vapor chamber creation to be stored in one place, downstream of commercial third party CAD software. Moving the vapor chamber-specific build details to internal software can improve both security and part quality because a link between the vapor chamber subsection geometry and the parameters can be ensured in the software.

For a three-dimensional printed vapor chamber, the wall 1608 is desired to be as thin as possible so that heat is transferred into the interior chamber of the vapor chamber more efficiently than a thicker outer wall. Previous attempts at three-dimensional printing of vapor chambers involve making one domain that is tagged as a solid domain (completely hermetic), such as the wall region model shown in FIG. 19. One disadvantage of this approach is that a computer-aided drafting (CAD) file may need to be provided for the solid domain (e.g., the wall 1508) and another file for the porous domain (e.g., the wick structure 1506). The solid domain can be difficult to make very thin using this technique. One embodiment of the method 1600 involves applying a single laser pass to the outer perimeter of the porous domain (which is considered an outer contour on a part). This technique can be used to form a very thin hermetic wall 1608.

The additive manufacturing or three-dimensional printing system can be provided with just the porous wick domain and the porous wick domain can be identified, or tagged, in a way that the printing system draws a single laser pass contour around the porous wick domain as the printing system builds. This can achieve a very thin (or the thinnest) hermetic wall that can be manufactured with the printing system.

Figure 21:
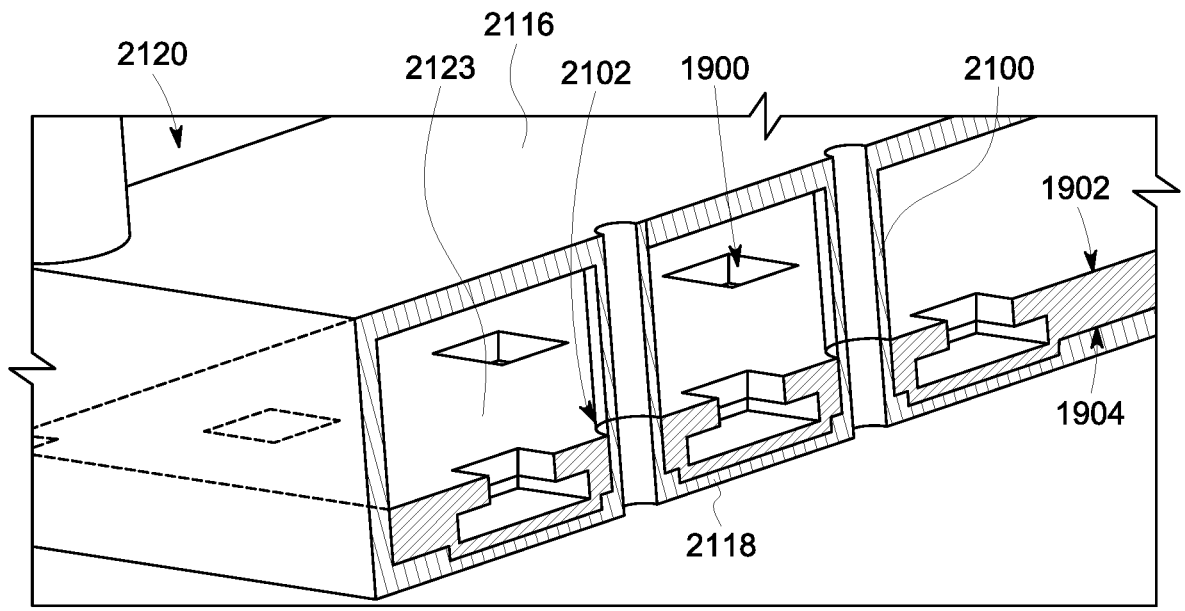
FIG. 21 illustrates a cross-sectional view of another embodiment of a vapor chamber.

FIG. 21 illustrates a cross-sectional view of another embodiment of a vapor chamber 2120. The vapor chamber 2120 can be used in a cooling assembly in place of the vapor chamber 20 or other vapor chambers described herein. The vapor chamber 2120 can be an additively manufactured enclosure having a porous interior wick structure 2123 and optionally a porous exterior wick structure, such as the wick structure 723 shown in FIG. 7. In the illustrated embodiment, the interior wick structure 2123 includes the pores 1900 described herein. Alternatively, the interior wick structure 2123 does not include the pores 1900.

The vapor chamber 2120 includes several hollow support posts 2100 that extend from one wall 2116 of the vapor chamber 2120 to an opposing wall 2118 of the vapor chamber 2120. As shown in FIG. 21, the interior wick structure 2123 includes channels 2102 through which the support posts 2100 can extend to the wall 2116 and/or 2118. These posts 2100 can be spaced apart from each other and/or arranged in a regularly repeating pattern (e.g., a grid), or may be randomly arranged. The posts 2100 can be additively manufactured with the walls 2116, 2118 of the vapor chamber 2120. The posts 2100 can internally support the walls 2116, 2118 such that the walls 2116, 2118 are prevented from moving toward each other or the distance that the wall 2116 and/or 2118 moves toward the opposite wall 2118 and/or 2116 is reduced (relative to a vapor chamber that does not include the support posts 2100).

For example, the atmosphere inside the vapor chamber 2120 can be a vacuum or other low-pressure atmosphere (or absence of an atmosphere), with liquid and/or gas phases of a working fluid in the vapor chamber 2120. This vacuum or low-pressure atmosphere can draw, pull, or otherwise exert forces on the wall 2116 and/or the wall 2118 that pull the walls 2116, 2118 inward and toward each other. The support posts 2100 can prevent the walls 2116, 2118 from moving toward each other, or can limit how far the walls 2116, 2118 move toward each other. This can assist in ensuring the consistent flow of the liquid phase and/or gas phase of the working fluid (relative to the walls 2116, 2118 moving closer together and/or contacting each other).

In the illustrated embodiment, the support posts 2100 are hollow. For example, the support posts 2100 can be cylindrical bodies that extend from the wall 2116 to the wall 2118. The empty space in the support posts 2100 can assist with cooling or transferring heat from the component 104. For example, the insides of the support posts 2100 (which also are located inside the vapor chamber) can include liquid and/or gas phases of additional coolant, or can include a vacuum or atmosphere that assists in the transfer of heat out of the vapor chamber 2120.

Alternatively, one or more of the support posts 2100 can include a porous wick structure similar to the interior or exterior wick structures described herein. This internal wick structure of the support posts 2100 can be located inside the support posts 2100, and can laterally extend through the support posts 2100 and/or longitudinally extend beyond one or more of the opposite ends of the support posts 2100 so that the interior wick structure of the support post(s) 2100 is fluidly and/or fluidically coupled with the interior wick structure inside the vapor chamber (and outside of the support post(s) 2100 while remaining inside the vapor chamber). This can allow for working fluid to flow between the interior wick structure of the posts 2100 and the interior wick structures of the vapor chamber.

Figure 22:
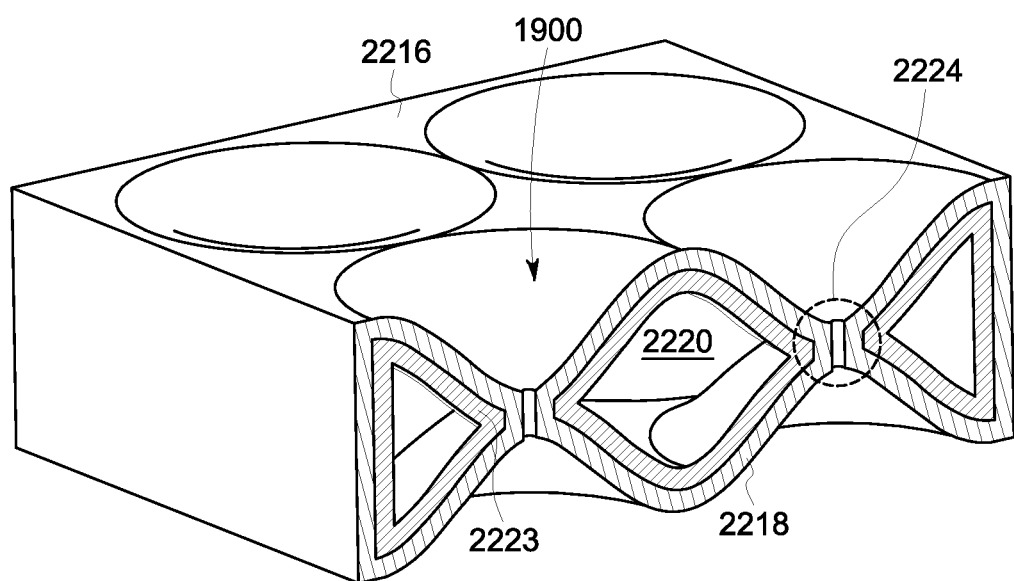
FIG. 22 illustrates a cross-sectional view of another embodiment of a vapor chamber.

FIG. 22 illustrates a cross-sectional view of another embodiment of a vapor chamber 2220. The vapor chamber 2220 can be used in a cooling assembly in place of the vapor chamber 20 or other vapor chambers described herein. The vapor chamber 2220 can be an additively manufactured enclosure having a porous interior wick structure 2223 and optionally a porous exterior wick structure, such as the wick structure 723 shown in FIG. 7.

The vapor chamber 2220 is formed by several walls, including opposing, contacting, and non-planar walls 2216, 2218. The walls 2216, 2218 are non-planar in that each wall 2216, 2218 includes dimples 1102 that protrude toward the opposing wall 2216, 2218. In the illustrated embodiment, the dimples 1102 in one wall 2216 or 2218 protrude sufficiently far to contact opposing dimples 1102 on the opposing wall 2218 or 2216 at one or more contact regions 2224.

The contact between the dimples 1102 can internally support the walls 2216, 2218 such that the walls 2216, 2218 are prevented from moving toward each other or the distance that the wall 2216 and/or 2218 moves toward the opposite wall 2218 and/or 2216 is reduced (relative to a vapor chamber that does not include the dimples 1102 shown in FIGS. 20-21).

For example, the atmosphere inside the vapor chamber 2220 can be a vacuum or other low-pressure atmosphere (or absence of an atmosphere), with liquid and/or gas phases of a coolant in the vapor chamber 2220. This vacuum or low-pressure atmosphere can draw, pull, or otherwise exert forces on the wall 2216 and/or the wall 2218 that pull the walls 2216, 2218 inward and toward each other. The contact between the dimples 1102 can prevent the walls 2216, 2218 from moving toward each other, or can limit how far the walls 2216, 2218 move toward each other.

In one embodiment, a cooling assembly includes walls extending around and defining an enclosed vapor chamber configured to hold a liquid phase and a gas phase of a working fluid inside the vapor chamber. The vapor chamber extends along at least two orthogonal dimensions. The cooling assembly also includes interior porous wick structure disposed inside and lining one or more interior surfaces of the walls. The interior porous wick structure includes pores that are configured to hold the liquid phase of the working fluid inside the vapor chamber. The cooling assembly also includes an exterior porous wick structure lining one or more exterior surfaces of the walls outside of the vapor chamber. The exterior porous wick structure includes pores that are configured to hold a liquid phase of a cooling fluid outside of the vapor chamber. The pores of the interior porous wick structure are configured to hold the liquid phase of the working fluid inside the vapor chamber until heat from the heat source vaporizes the liquid phase of the working fluid inside the vapor chamber into the gas phase inside the enclosed vapor chamber. The exterior porous wick structure is configured to hold the liquid phase of the cooling fluid until at least some of the heat from inside the enclosed vapor chamber vaporizes the liquid phase of the working fluid in the exterior porous wick structure outside of the vapor chamber into the gas phase outside of the enclosed vapor chamber for transferring the heat from the heat source away from the heat source.

Optionally, the walls hermetically seal the vapor chamber.

Optionally, the walls seal the interior porous wick structure from the exterior porous wick structure and prevent any of the liquid phase of the working fluid and any of the gas phase of the working fluid from entering into the pores of the exterior porous wick structure.

Optionally, the cooling assembly also includes a reservoir chamber disposed outside of the walls and outside of the vapor chamber. The reservoir chamber is fluidly coupled with the exterior porous wick structure.

Optionally, the reservoir chamber is configured to hold at least part of the cooling fluid in the liquid phase in the pores of the exterior porous wick structure.

Optionally, the reservoir chamber is a passive reservoir that receives additional cooling fluid from an ambient atmosphere.

Optionally, the reservoir chamber is fed with additional cooling fluid from one or more active pumps.

Optionally, the walls, the exterior porous wick structure, and the interior porous wick structure are additively manufactured structures.

Optionally, the walls, the exterior porous wick structure, and the interior porous wick structure include laser-welded metal particles.

Optionally, the walls form one or more surface area enhancement structures forming elongated extensions of the vapor chamber.

Optionally, the one or more surface area enhancement structures are planar fin extensions of the vapor chamber.

Optionally, the interior porous wick structure extends along one or more interior surfaces of the one or more surface area enhancement structures.

Optionally, the exterior porous wick structure extends along one or more exterior surfaces of the one or more surface area enhancement structures.

Optionally, one or more of the walls is a non-planar wall.

Optionally, one or more of the walls includes a repeating array, grid, pattern, or arrangement of one or more protrusions.

Optionally, the repeating array, grid, pattern, or arrangement of the one or more protrusions is a repeating rectangular pattern of the one or more protrusions.

Optionally, the repeating array, grid, pattern, or arrangement of the one or more protrusions is a repeating hexagonal pattern of the one or more protrusions.

Optionally, the repeating array, grid, pattern, or arrangement of the one or more protrusions is a repeating square pattern of the one or more protrusions.

Optionally, the repeating array, grid, pattern, or arrangement of the one or more protrusions includes a first repeating pattern of the one or more protrusions and a second repeating pattern of open spaces having no protrusions.

Optionally, the first repeating pattern of the one or more protrusions is interspersed with the second repeating pattern of the open spaces having no protrusions.

Optionally, the one or more protrusions protrude from the one or more walls.

Optionally, the one or more protrusions inwardly protrude from the one or more walls into the vapor chamber.

Optionally, the one or more protrusions outwardly protrude from the one or more walls away from the vapor chamber.

Optionally, the one or more protrusions extend along two or more orthogonal dimensions.

Optionally, the one or more protrusions extend along only a single dimension.

Optionally, two or more opposing walls of the walls forming the vapor chamber include the one or more protrusions.

Optionally, the one or more protrusions in a first wall of the two or more opposing walls are in-phase with the one or more protrusions in a second wall of the two or more opposing walls.

Optionally, the one or more protrusions in a first wall of the two or more opposing walls are out of phase with the one or more protrusions in a second wall of the two or more opposing walls.

Optionally, the one or more protrusions in a first wall of the two or more opposing walls are arranged in a first repeating pattern and the one or more protrusions in an opposing second wall of the two or more opposing walls are arranged in a different, second repeating pattern.

Optionally, the cooling assembly includes one or more support columns extending from a first wall of the walls forming the vapor chamber to an opposing second wall of the walls forming the vapor chamber.

Optionally, the one or more support columns are hollow.

Optionally, the one or more support columns include an interior porous wick structure inside the one or more support columns.

Optionally, the interior porous wick structure inside the one or more support columns and inside the vapor chamber is fluidly coupled with the interior porous wick structure.

Optionally, a thickness of at least one of the interior or exterior porous wick structure is not uniform along one or more of a length or a width of the at least one interior or exterior porous wick structure.

Optionally, at least one of the interior or exterior porous wick structures includes thicker portions and thinner portions. The thinner portions can include vents extending into the wick structure from at least one side of the wick structure.

Optionally, the vents extend into the at least one of the interior or exterior porous wick structures from the side of the at least one of the interior or exterior porous wick structures that is exposed in the vapor chamber.

Optionally, a size of the pores in at least one of the interior or exterior porous wick structures is not uniform along one or more of a length or a width of the at least one interior or exterior porous wick structure.

Optionally, both a thickness and a pore size in at least one of the interior or exterior porous wick structures vary at different locations in the at least one of the interior or exterior porous wick structures.

In one embodiment, an additively manufactured body includes one or more substantially planar walls having one or more protrusions extending into or out of the one or more walls.

Optionally, the one or more walls include a repeating array, grid, pattern, or arrangement of the one or more protrusions.

Optionally, the one or more protrusions extend along two or more orthogonal dimensions.

Optionally, the one or more protrusions extend along only a single dimension.

In one embodiment, an additively manufactured assembly includes a porous wick structure including pores that are configured to hold a liquid phase of a fluid. One or more of a thickness of the porous wick structure is not uniform along one or more of a length or a width of the porous wick structure, and/or a size of the pores in the porous wick structure is not uniform along one or more of the length, the width, and/or the thickness of the porous wick structure.

In one embodiment, a method includes obtaining a single three-dimensional model of a chamber to be formed using a laser of an additive manufacturing system, and laser-welding metal particles using a single pass of the laser according to the single three-dimensional model of the chamber to form a thin, hermetic outer wall of the chamber.

As used herein, an element or step recited in the singular and proceeded with the word "a" or "an" does not exclude plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The above description is illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. An additively manufactured assembly comprising:
   one or more hermetically sealed outer walls; and
   one or more porous wick structures (i) being disposed on the one or more hermetically sealed outer walls and (ii) including a plurality of pores that are configured to hold a liquid phase of a fluid;
   wherein a first group of the one or more porous wick structures is disposed on one or more interior surfaces of the one or more hermetically sealed outer walls, and a second group of the one or more porous wick structures is disposed on one or more exterior surfaces of the one or more hermetically sealed outer walls; and
   wherein one or more of:
   a thickness of the one or more porous wick structures is not uniform along one or more of a length or a width of the one or more porous wick structures, or
   a size of the plurality of pores in the one or more porous wick structures is not uniform along one or more of the length, the width or the thickness of the one or more porous wick structures.

2. The additively manufactured assembly of claim 1, wherein one or more of the one or more hermetically sealed outer walls is non-planar.

3. The additively manufactured assembly of claim 2, further comprising:
   one or more support columns extending from a first hermetically sealed outer wall to an opposing second hermetically sealed outer wall.

4. The additively manufactured assembly of claim 3, wherein one or more of the one or more support columns is hollow.

5. The additively manufactured assembly of claim 3, wherein one or more of the one or more support columns further comprises a second porous wick structure.

6. The additively manufactured assembly of claim 1, further comprising:
   a plurality of vents in the one or more porous wick structures that at least extend into the one or more porous wick structures.

7. The additively manufactured assembly of claim 6, wherein at least one vent extends through each porous wick structure of the one or more porous wick structures.

8. A method of additively manufacturing an assembly, the method comprising:
   forming one or more hermetically sealed outer walls in the assembly;
   forming one or more a porous wick structures on the one or more hermetically sealed outer walls, the one or more porous wick structures including a plurality of pores that are configured to hold a liquid phase of a fluid;
   wherein a first group of the one or more porous wick structures is disposed on one or more interior surfaces of the one or more hermetically sealed outer walls, and a second group of the one or more porous wick structures is disposed on one or more exterior surfaces of the one or more hermetically sealed outer walls; and
   wherein one or more of:
   a thickness of the one or more porous wick structures is not uniform along one or more of a length or a width of the one or more porous wick structures, or
   a size of the plurality of pores in the one or more porous wick structures is not uniform along one or more of the length, the width, or the thickness of the one or more porous wick structures, wherein forming the one or more porous wick structures comprises welding a plurality of particles together with a laser.

9. The method of claim 8, further comprising:
   varying one or more of a size of the plurality of particles or a power of the laser or a duration of an exposure of the plurality of particles to the laser with respect to one or more of a time or a location of the one or more porous wick structures.

10. The method of claim 9, further comprising:
    varying the size of the plurality of particles, the power of the laser, and the duration of the exposure of the plurality of particles to the laser with respect to the time and the location of the one or more porous wick structures.

11. The method of claim 8, wherein forming the one or more hermetically sealed outer walls comprises scanning the laser in a single pass of the additively manufactured assembly.

12. The method of claim 8, wherein at least one of the one or more hermetically sealed outer walls is non-planar.

13. The method of claim 8, further comprising:
    forming one or more support columns extending from a first hermetically sealed outer wall to an opposing second hermetically sealed outer wall.

14. The method of claim 13, wherein one or more of the one or more support columns is hollow.

15. The method of claim 13, wherein one or more of the one or more support columns further comprises a second porous wick structure.

16. The method of claim 8, further comprising:
    forming a plurality of vents in the one or more porous wick structures that at least extend into the one or more porous wick structures.

17. The method of claim 16, wherein at least one vent of the plurality of vents extends through each porous wick structure of the one or more porous wick structures.

18. The additively manufactured assembly of claim 1, wherein the one or more hermetically sealed outer walls are planar, cylindrical or three-dimensional in shape.

* * * * *